(12) United States Patent
Buckley

(10) Patent No.: US 8,978,641 B2
(45) Date of Patent: Mar. 17, 2015

(54) SOLAR ENERGY MODULE

(76) Inventor: B. Shawn Buckley, Las Cruces, NM (US)

( * ) Notice: Subject to any disclaimer, the term of this patent is extended or adjusted under 35 U.S.C. 154(b) by 1212 days.

(21) Appl. No.: 12/661,321

(22) Filed: Mar. 13, 2010

(65) Prior Publication Data

US 2010/0229852 A1 Sep. 16, 2010

Related U.S. Application Data

(60) Provisional application No. 61/210,198, filed on Mar. 16, 2009.

(51) Int. Cl.
*F24J 2/50* (2006.01)
*F24J 2/10* (2006.01)
(Continued)

(52) U.S. Cl.
CPC .. *F24J 2/10* (2013.01); *F24J 2/055* (2013.01); *F24J 2/07* (2013.01); *F24J 2/1057* (2013.01); *F24J 2/38* (2013.01); *F24J 2/40* (2013.01); *F24J 2/4636* (2013.01); *F24J 2/52* (2013.01); *F24J 2/541* (2013.01); *H01L 31/0422* (2013.01); *H01L 31/0522* (2013.01); *F24J 2/4623* (2013.01); *H01L 31/058* (2013.01); *F24J 2/4638* (2013.01); *F24J 2002/108* (2013.01); *F24J 2002/5482* (2013.01); *Y02B 10/12* (2013.01); *Y02B 10/22* (2013.01); *Y02E 10/41* (2013.01); *Y02E 10/44* (2013.01); *Y02E 10/47* (2013.01);
(Continued)

(58) Field of Classification Search
USPC ......... 126/648, 652, 654, 571, 576, 573, 692, 126/696, 569
See application file for complete search history.

(56) References Cited

U.S. PATENT DOCUMENTS 3,868,823 A * 3/1975 Russell, Jr. et al. ........ 60/641.15
4,109,640 A   8/1978 Smith
(Continued)

*Primary Examiner* — John K Fristoe, Jr.
*Assistant Examiner* — Kevin E Lynn
(74) *Attorney, Agent, or Firm* — William B. Ritchie

(57) ABSTRACT

A low cost mass-produced solar module that extracts both electricity and heat from the sun. One or more reflectors held by a frame reflect the sun's heat into an absorber. Each reflector rotates about its axle to keep its reflected solar energy focused on the absorber. In one embodiment, solar heat is focused to heat fluid that flows to thermodynamic engines that convert the heat to electricity. Engine waste heat is also captured for use as building heat, home hot water or industrial process heat. In another embodiment, solar heat is focused onto photovoltaic devices that directly convert light into electricity. The fluid that cools the photovoltaic devices can be used for building heat, home hot water or industrial process heat. The frame shields the reflectors from ambient wind loads, supports reflector axles accurately and simplifies installation on roofs or walls of buildings. The frame, reflectors, absorber and ancillary components comprise a module that can be shipped, installed and operated by low skill. Most components are fabricated using "double wall" construction formed by two face sheets held apart by a core that reduces their weight and their cost. Reflector surfaces are curved to focus the sun and to provide additional strength. Module design includes methods to install, maintain and verify proper functioning of the modules. In addition, methods show how electrical energy can be derived from the module, both circulating fluids that power thermodynamic engines and by photovoltaic cells that are cooled by the circulating fluid. Sensors contained in the modules detect aberrant behavior and optimize reflector trajectories to extract the most solar heat available. Communication between modules allows optimization of an array of modules.

12 Claims, 10 Drawing Sheets

(51) Int. Cl.
  *F24J 2/05* (2006.01)
  *F24J 2/07* (2006.01)
  *F24J 2/38* (2014.01)
  *F24J 2/40* (2006.01)
  *F24J 2/46* (2006.01)
  *F24J 2/52* (2006.01)
  *F24J 2/54* (2006.01)
  *H01L 31/042* (2014.01)
  *H01L 31/052* (2014.01)
  *H01L 31/0525* (2014.01)

(52) U.S. Cl.
  CPC  *Y02E 10/52* (2013.01); *Y02E 10/60* (2013.01); *F24J 2002/5468* (2013.01); *Y02B 10/70* (2013.01)

USPC .......................................................... 126/652

(56) References Cited

U.S. PATENT DOCUMENTS

| | | | | |
|---|---|---|---|---|
| 4,184,895 | A | * | 1/1980 | Oster, Jr. ........................ 136/247 |
| 4,258,701 | A | | 3/1981 | Buckley |
| 4,261,335 | A | * | 4/1981 | Balhorn ........................ 126/602 |
| 4,716,258 | A | * | 12/1987 | Murtha ........................ 136/246 |
| 6,035,850 | A | * | 3/2000 | Deidewig et al. ............. 126/696 |
| 6,131,565 | A | | 10/2000 | Mills |
| 7,381,886 | B1 | | 6/2008 | Aiken et al. |
| 2005/0034752 | A1 | * | 2/2005 | Gross et al. ................... 136/246 |
| 2008/0302314 | A1 | | 12/2008 | Gonzalez et al. |

* cited by examiner

SOLAR ENERGY MODULE

This application claims benefit of U.S. Provisional Application Ser. No. 61/210,198 filed Mar. 16, 2009, pursuant to 35 USC §119(e).

FIELD OF THE INVENTION

This invention relates to energy production, in particular, a low-cost mass-produced solar module that extracts both electricity and heat from the sun.

BACKGROUND OF THE INVENTION

Solar energy becomes an alternative to burning fossil fuels when the installed cost of the solar energy harvesting system is low and the value of the captured energy is high. Payback period is a simple way of judging the economics of alternative energy systems. The payback period is the installed cost of the system divided by its yearly energy savings; its units are usually in years.

The installed cost is composed of two components. One is the system cost, the sum of all the components of the system itself. The system cost is kept low by fabricating a system from low-cost materials and by reducing the weight of these materials to the minimum while still resisting structural loads that are experienced during its lifetime. The other component is the cost of the system's installation. Since on-site installation can be as costly as the system cost, reducing on-site installation costs leads to a lower installed cost and faster payback period.

Solar energy systems that have been developed over the last five decades have lowered the system cost substantially. However, many of these systems are installed on the roof of a building where building codes are in force. The lowest installed cost is usually one where the installation tasks are few and simple enough for low-skill workmen.

At any particular latitude, solar heat comes to the earth as a flux (energy per unit area) that is nearly constant above the cloud cover. With no clouds, solar collectors or reflectors capture this flux in proportion to their area. The bigger the area, the more solar energy is available. Often solar energy costs are measured by their cost per unit area, (e.g., dollars per square meter) in order to compare big systems with small systems. The cheapest solar energy systems are ones that have the lowest installed cost per unit area. The system's efficiency is the ratio of the solar energy utilized and the solar energy available. For example, a photovoltaic system that converts 20% of the solar energy falling on it into electricity has an efficiency of 20%. Usually the efficiency is given for "peak" conditions: the efficiency of a system pointed normal to the sun's flux at solar noon on a clear day. In summary, the solar energy systems with the shortest payback have the highest efficiency (high utilization of the solar energy) at the lowest installed cost.

Other variables such as time of day, solar fraction (% of sunshine that makes it through the clouds), direction of collector surface normal and latitude affect the absolute value of the solar energy that can be extracted. But for two solar energy systems of the same size at the same location pointed in the same direction, the design of the system is the most important factor determining payback period.

As noted above, the design of the system should have minimal costs of all its components and should be easy to install with low-skill workers. In addition, the system should have high efficiency in converting the available solar flux into useful energy. Useful energy comes in two forms: electricity and heat. The electricity is useful because it can offset the electricity required from the electric grid and can even augment grid electricity. The heat is useful in an industrial setting for process heat and for factory space heating. In a residential setting, domestic hot water heating and space heating can be augmented by solar energy.

In many solar energy systems that generate electricity, the heat portion is not used. It is called "waste heat" because the heat is often dumped to the atmosphere and wasted. The ability to use waste heat is an important one because contemporary thermodynamic and photovoltaic conversion is typically 20% or less. That means 80% of the available solar flux is wasted unless it can be used locally.

In addition to having low cost components and being easily installed, the most efficient solar energy systems must also use waste heat (energy not converted to electricity).

Heliostats are reflectors that move in response to the sun's position in the sky. Heliostats have been used for over a century to concentrate solar energy. For example, U.S. Pat. No. 4,109,640, 1978 issued Aug. 29, 1978 to Smith uses heliostats. Similar heliostat-based concentrating system, using photovoltaics have recently been disclosed in U.S. Pat. No. 7,381,886, issued Jun. 3, 2008 to Aiken et al. Heliostats track the sun by moving their reflecting surfaces in either one or two axes.

One of the dominant structural loads of any solar energy system is wind loading. The cost of the structure that must hold and align a system's reflectors is usually lower in a one-axis tracking system than in a two axis tracking system. Single axis concentrating systems called "trough" systems have been developed by several companies. One in commercial production is by Spanish company, Abengoa Solar New Technologies, S.A. (Seville, Spain) disclosed in U.S. Patent Application Serial No. 20080302314 published Dec. 11, 2008 to Gonzalez et al. Another is Ausra (Palo Alto, Calif.) with U.S. Pat. No. 6,131,565 issued Oct. 17, 2000 to Mills.

The Abengoa system has a solar absorber associated with each reflector structure that moves with the reflector. Ausra uses a fixed absorber with reflectors that are supported for rotation by small wheels.

One important structural component in a concentrating system is the reflector, a mirror-like component that reflects solar energy onto an absorber. Reflectors used by Abengoa and Ausra use coated glass as the reflecting surface; a metal framework holds the glass and allows the glass to rotate and focus solar energy on the absorber.

Double wall construction is used to advantage in a passive solar heater in U.S. Pat. No. 4,258,701 (1981) by the present inventor.

There is no found in the prior art an apparatus that tracks the sun in one axis to avoid the cost and complexity of a two axis tracking system. In addition, in single axis tracking, reflector surfaces can be kept close to the ground or to the structure to which they are attached. The present invention uses double wall construction in a unique way to reduce the component cost and installation cost while simultaneously capturing most of the waste heat. In this invention, solar energy is concentrated by heliostats. It uses a fixed absorber and reflectors that rotate on axles. The present invention instead uses double wall construction for the reflectors, forming a unitary structure capable of bearing loads, especially wind-induced bending loads. An inner core prevents the two walls from buckling in compression while keeping the load-carrying walls far from the bending axis.

SUMMARY OF THE INVENTION

It is an aspect of the invention to provide a low-weight solar module using one or more reflectors held rigidly by a frame that reflect solar energy onto an absorber that efficiently extracts solar energy as the flow of a heated fluid or as photovoltaic generated electricity.

Another aspect of the invention is a low-eight solar module that has reflectors that pivot on axles in a frame such that the reflector surfaces extend beyond the planform of the frame, reducing the shadowing of one reflector on another that can otherwise occur.

Another object of the invention is to provide tilting means for the module to be tilted with respect to its installed surface maximize the solar energy utilized.

Another object of the invention is to provide a method of manufacture for the module components using double wall construction to produce a reflector that can withstand high wind loading over its faces while maintaining accurate focusing of solar energy on the absorber of the module.

Another object of the invention is to provide a module that can be efficiently packed for shipment by the use of interlocking features on the modules, by simple deployment of packed modules at the installation site and by embedding fragile components within the structure to avoid shipping damage.

Another object of the invention is to provide motors that rotate the reflector components about their long axis under microprocessor control and which motor casing also act as the axle for the reflector components.

Another object of the invention is to construct the module frame using double wall construction that structurally withstands failure to lifetime loads while simultaneously minimizing the materials used in the frame structure.

Another object of the invention is to construct the module's solar energy absorber component to reduce heat loss from absorbing surfaces, to protect fragile internal components, to structurally withstand failure under lifetime loads while simultaneously minimizing the materials used in the absorber structure and to allow for simple connection of one absorber to another during field installation.

DETAILED DESCRIPTION OF THE INVENTION

In the following, each member of a set of similar components will have a suffix letter (a, b, c, d . . . ) to distinguish each individual member of the set. For example, reflectors 3 refer to the set of reflectors 3a, 3b, 3c, and 3d. Another annotation uses ellipses (a series of dots) between the set's first element and the set's last element to describe a set, i.e., reflectors 3 can also be referred to as 3a . . . 3d.

Figure 1:
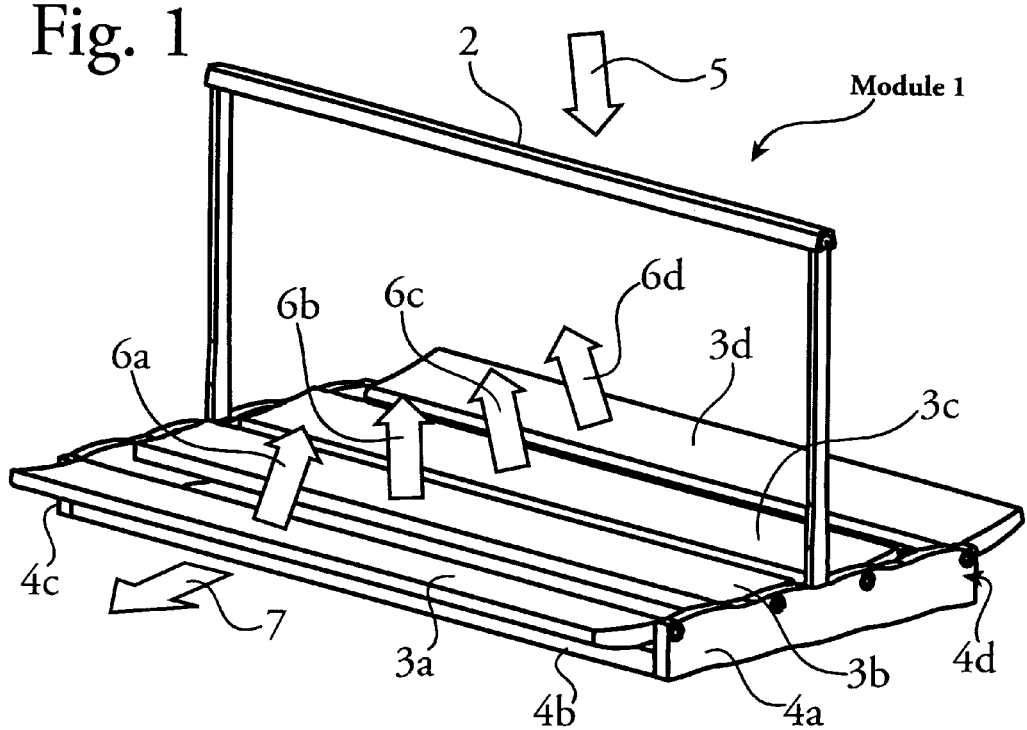
FIG. 1 is a diagrammatic three-dimensional representation of the present device shown in normal usage absorbing solar energy with the sun high in the sky

FIG. 1 shows the preferred embodiment of module 1 during normal usage absorbing solar energy from the sun. The sun's energy is shown diagrammatically as the arrow 5 directing solar energy onto the module 1. Solar energy is reflected from reflectors 3a . . . 3d onto absorber 2 where it heats a fluid flowing through absorber 2 or generates electricity by photovoltaic devices within absorber 2.

Each of reflectors 3a . . . 3d reflect some portion of the solar energy 5 directed on a reflector 3 to the absorber 2. Each reflector 3a . . . 3d redirects solar energy 5 as solar energy 6a . . . 6d. Reflector 3a redirects reflected solar energy 6a onto absorber 2, reflector 3b redirects reflected solar energy 6b onto absorber 2 and so forth for all reflectors 3a . . . 3d. Each reflector 3 rotates about its axles 9 (FIG. 2) during the day to individually reflect solar energy onto absorber 2 such that most solar energy directed on a reflector 3 is absorbed by absorber 2. The rotational axis of each reflector 3 is determined by axles 9 at each end of reflector 3. Note that while four reflectors 3 are shown, module 1 could have as few as one reflector 3 or more than four reflectors 3.

Frame 4 is composed of two sides, 4b and 4d that are parallel to each other and two ends 4a and 4c that are perpendicular to sides 4b and 4d. The sides 4a . . . 4d form the rectangle frame 4. Frame 4 provides the structure that holds reflectors 3 in the proper geometric relationship with absorber 2.

Figure 2:
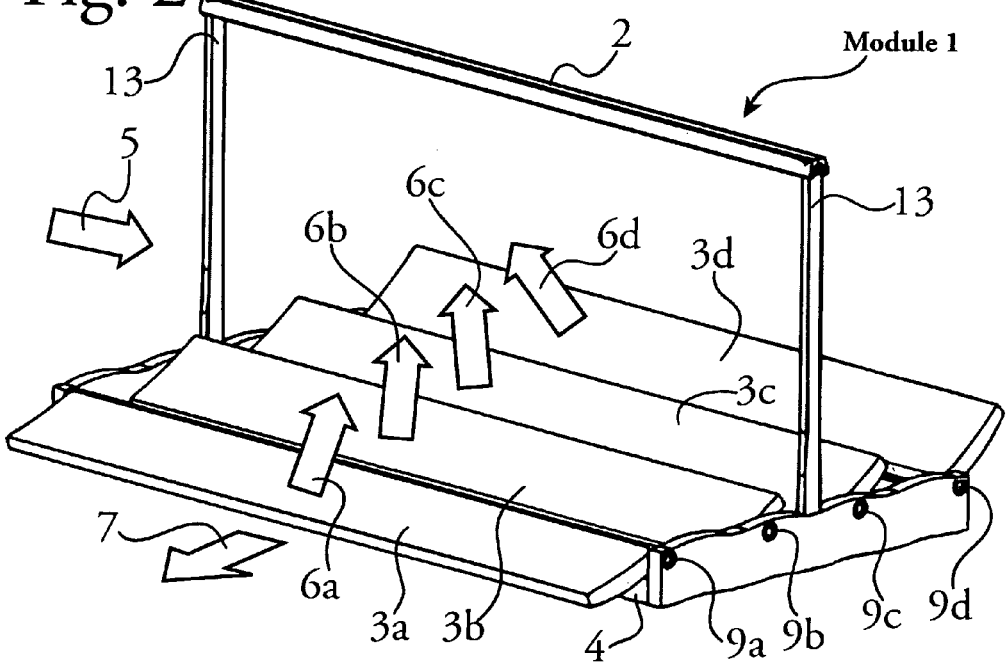
FIG. 2 is a diagrammatic three-dimensional representation of the present device shown in normal usage absorbing solar energy with the sun low in the sky

The same module 1 is shown in FIG. 2 but in this case the solar energy 5 comes from the sun when it is lower in the sky. Here, reflectors 3 have rotated about their long axis on axles 9a . . . 9d to redirect reflected solar energy 6 from each reflector 3 onto absorber 2. The operation of reflectors 3 is such that throughout the day they continuously rotate to redirect their solar energy onto absorber 2. Axles 9 are held accurately by frame ends 4a and 4c allowing reflectors 3 to rotate about their respective axle 9.

Rotation of Reflectors

Rotation mechanisms associated with the rotational axes of axles 9a . . . 9d of each reflector 3 are held by frame end members 4a and 4c and rotate reflectors 3 based on the direction of the sun vector 5. During daytime operation, these mechanisms position the reflecting surfaces of reflectors 3 to focus solar energy 5 on absorber 2. As the sun moves through the sky from low morning sun (FIG. 2) to high noontime sun (FIG. 1) to low afternoon sun (FIG. 2), accurate rotation of reflectors 3 assure that a large portion of the sun's energy 5 will be captured by absorber 2.

Note that in the preferred embodiment, the long axis of module 1 (i.e., the rotational axes of reflectors 3) are perpendicular to south direction 7 such that in middle latitudes the sun is high in the sky at solar noon, but is lower in the sky in the mornings and evenings. While this orientation provides the highest absorption efficiency of reflectors 3, reflectors 3 reflect a lesser degree of solar energy 5 onto absorber 2 even if the orientation of module 1 is not ideal.

In the preferred embodiment, absorber 2 is held by arms 13 that are held in place by a close-fitting slot in frame ends 4a and 4c. The angle is fixed relative to the plane of frame 4 at 90 degrees as shown in FIGS. 1 and 2. However, in some combinations of season, latitude and orientation, more efficient sunlight gathering results by changing the angle of arms 13. Usually the change in angle is a seasonal one and arms 13 are manually moved to a different angle and pinned in place from one season to the next. In other embodiments, the angle between arms 13 and the plane of frame 4 is rotated automatically with a motorized mechanism changing the arm 13 angle with time of day and season of the year for a particular orientation and latitude.

Off-Center Axes

Figure 3:
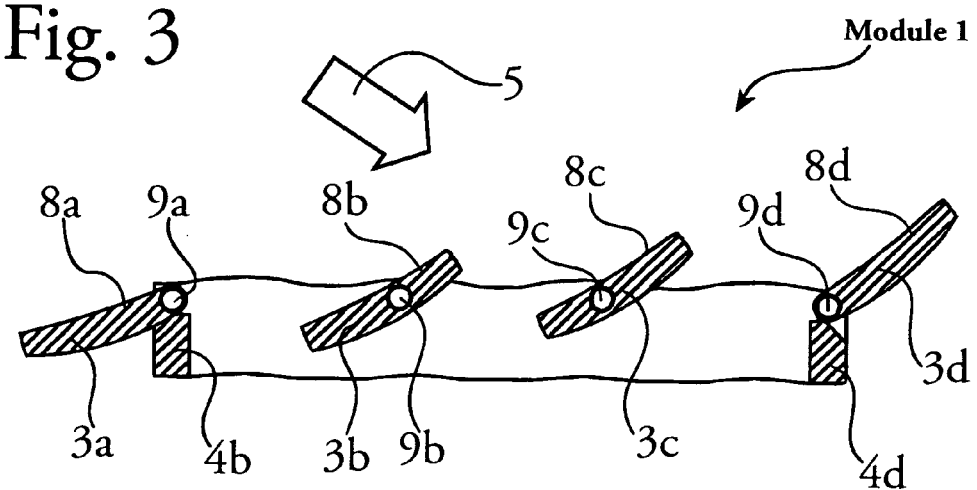
FIG. 3 is a cross sectional view of the present device that shows the components of FIG. 1 in more detail under high sun conditions.

FIG. 3 shows a cross section of module 1 shown in FIG. 2 (absorber 2 and arms 13 are not shown for clarity). Each reflector 3a . . . 3d rotates about its respective axle 9a . . . 9d. Reflectors 3a . . . 3d each have a shiny surface 8a . . . 8d that reflects solar energy 5 onto absorber 2 (FIGS. 1 and 2). Rotational axles 9a . . . 9d of each reflector 3a . . . 3d are held by frame ends 4a and 4c on each end of module 1.

In this preferred embodiment, axles 9 of reflectors 3 are not located at the geometric center of reflectors 3. Rather they are located off-center. Inner reflectors 3b and 3c have axles 9b and 9c located close to their geometric center while outer reflectors 3a and 3d have axles 9a and 9d near the edge of their reflector 3.

The purpose of the off-center axle 9 location is to allow reflector 3a to extend beyond the planform of frame side 4b and reflector 3d to extend beyond the planform of frame side 4d. As such, each reflector 3 has less shadowing of solar energy 5 onto adjacent reflectors 3. In FIG. 3, without off-center axles 9, the top portion of reflector 3b would block solar energy 5 from illuminating the lower portion of reflector 3c. Shadowing of adjacent reflectors can seriously reduce the amount of solar energy 5 captured by module 1, especially when the sun is not close to the frame 4 surface normal. The disadvantage of off-center reflector axles 9 is more area is required for a given number of modules 1. For example, in an industrial application where a factory roof is needed to produce electricity and heat, the roof may not be large enough to install the proper number of modules 1 to supply the factory's electricity or heat needs.

Tilting Module

Figure 4:
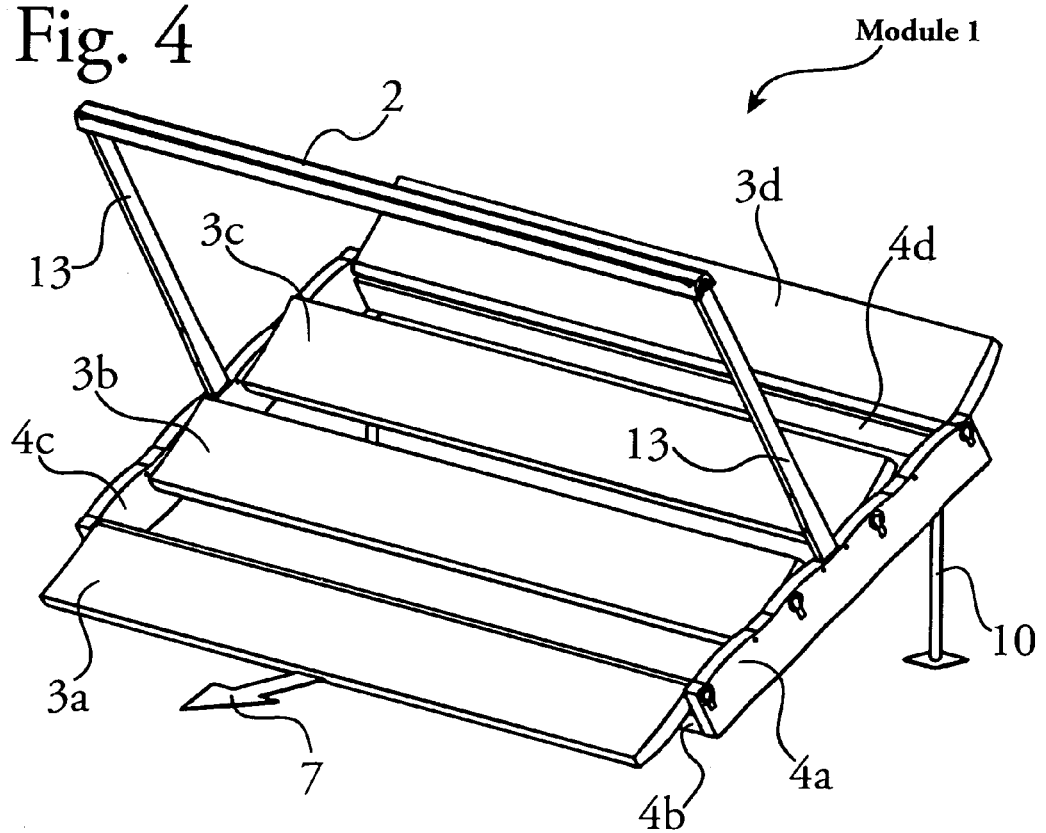
FIG. 4 is a diagrammatic three-dimensional representation of the present device shown tilted toward the south by tilting means.

FIG. 4 shows module 1 where frame 4 is held by supports 10 that hold frame side 4d higher than frame side 4b when the plane of frame 4 is tilted toward south direction 7. That is, the normal vector of frame 4 lies in the earth's north-south plane. At higher latitudes, tilting frame 4 toward south direction 7 reduces the amount of shadowing that reflectors 3 have on each other. For example in FIG. 2 with low sun, reflector 3a can cast a shadow onto the next reflector 3b which in turn can cast a shadow onto reflector 3c which can cast a shadow onto reflector 3d. When a reflector 3 receives less solar energy 5, the amount of reflected solar energy 6b . . . 6d (FIG. 2) on each shadowed reflector 3 is reduced, limiting the light gathering efficiency of module 1. By tilting the module 1 toward south direction 7 as in FIG. 4, less shadowing occurs and more solar energy can be delivered to absorber 2.

When the length of supports 10 is fixed, the resulting tilt angle is a compromise between summer and winter conditions. In some embodiments, the angle of tilt can be changed by changing the length of supports 10. Lengthening supports 10 results in a higher tilt suitable for winter operation when the sun is lower in the sky. Shortening supports 10 results in a lower tilt angle that provides more efficient light gathering in summer when the sun is higher in the sky. In some embodiments, the length changing of supports 10 is automatic. A mechanism driven by a motor adjusts the length of supports 10 to maximize the total reflected solar energy 6 redirected to absorber 2 for different latitudes, seasons and orientations of module 1.

Figure 5:
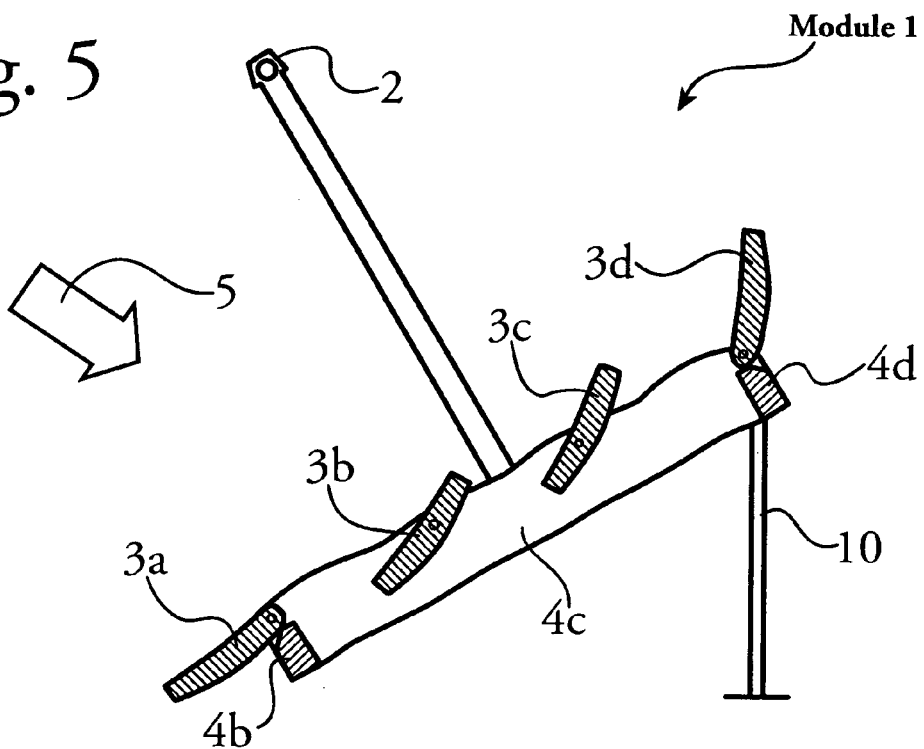
FIG. 5 is a cross sectional view of the present device that shows the components of the tilted module of FIG. 4.

A cross-sectional view of module 1, taken parallel to frame ends 4a and 4c in FIG. 4, is shown in FIG. 5. Sunlight 5 emanating from the sun when it is low on the horizon and shining on reflector 3b, for example, does not shadow adjacent reflector 3c. Between the off-center axle 9 location of reflectors 3 and tilt supports 10, most shadowing of one reflector 3 and an adjacent one can be eliminated.

Safe Mode

Figure 6:
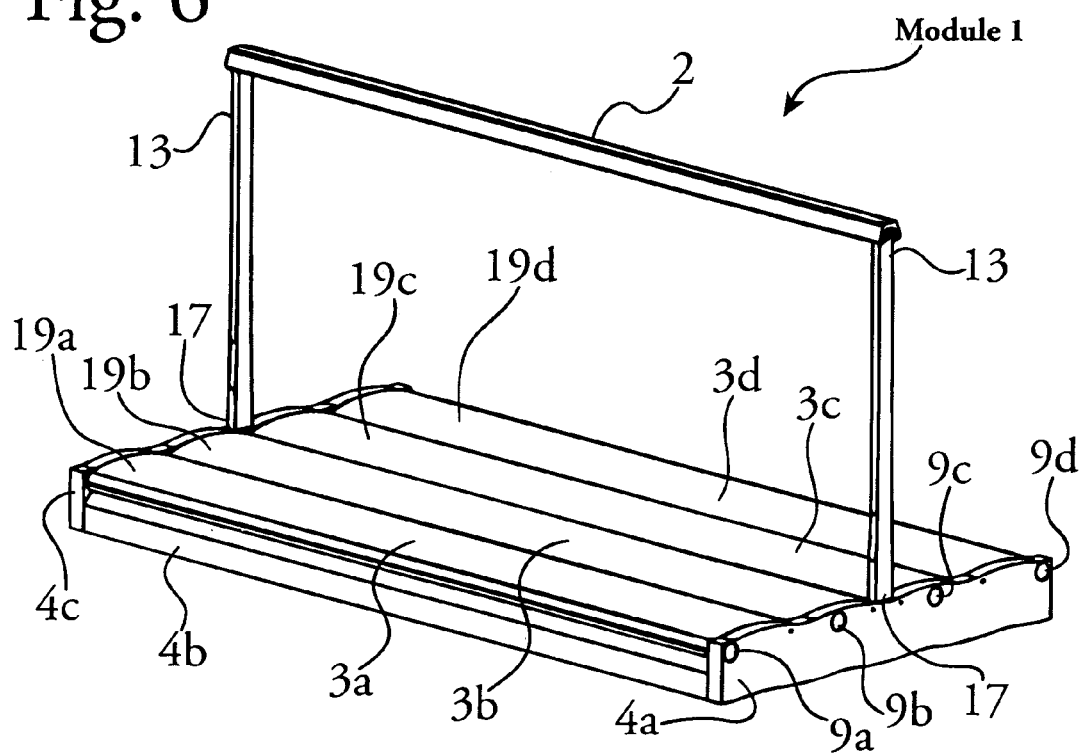
FIG. 6 is a diagrammatic three-dimensional representation of the present device shown with reflectors rotated to prevent damage to reflecting surfaces.

FIG. 6 shows the same module 1 as in FIGS. 1 and 2 except for the rotation of reflectors 3. At night or during inclement weather, reflectors 3a . . . 3d are rotated about their respective rotation axes 9a . . . 9d to a "safe mode." In safe mode, reflecting surfaces of reflectors 3 (on the opposite side of reflectors 3 than surfaces 19a . . . 19d) are turned inward to the interior of frame 4 to prevent damage. In the preferred embodiment, surfaces 19a . . . 19d of reflectors 3 are convex, thicker and more rugged than the reflecting surfaces on the other side of reflectors 3a . . . 3d.

Absorber 2 is held fixed by the ends of arms 13 fitted into slots 17 in frame ends 4a and 4c once module 1 is deployed at the installation site. In one embodiment, arms 13 are pinned or adhesively bonded to frame 4 after installation. In another embodiment, arms 13 have adjustment screws (not shown) that can adjust the angle of arms 13 slightly to be sure the axis of reflectors 3 is aligned to the axis of absorber 2.

Figure 7:
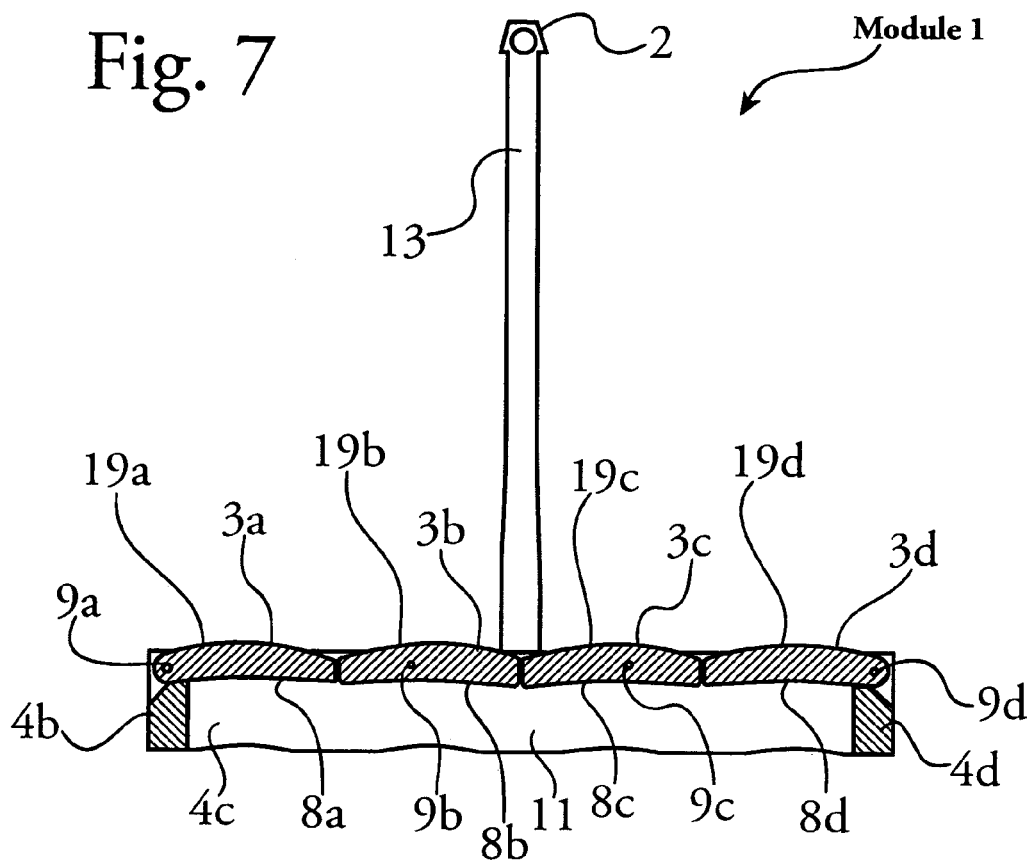
FIG. 7 is a cross sectional view of the present device shown in FIG. 6.

Shown in FIG. 7 is a cross-section view of module 1 in safe mode. Again the section cuts perpendicularly through the rotational axes of reflectors 3a . . . 3d. Each reflector 3a . . . 3d has two sides. One side 8a . . . 8d is concave, shiny and reflects solar energy 5. The other side is convex and non-reflecting. In safe mode, non-reflecting surfaces 19 of reflectors 3 face away from the frame 4 interior; reflecting surfaces 8 face toward the interior of frame 4. When in safe mode, the rotation mechanism of each reflector 3 continues to detect rotation and adjusts reflectors 3 to assure module 1 remains in safe mode.

Axles 9, despite their off-center location on reflectors 3, are designed to form a closed cavity 11 beneath module 1 in safe mode. Cavity 11 is closed on the top by the convex surfaces 19 of reflectors 3 and on the sides by frame members 4. In the preferred embodiment, the bottom of cavity 11 is the ground or roof on which module 1 is installed. Reflecting surfaces 8 of reflectors 3 are protected from damage by facing toward cavity 11. If not in safe mode, damage to reflecting surfaces 8 could occur from various influences such as high wind, hail, snow, ice, debris blown by the wind, animals and people. Even a tilted module 1 (FIGS. 4 and 5) can substantially reduce damage to reflecting surfaces 8 in safe mode.

In the preferred embodiment, sensors in module 1 (or sensors associated with an array of modules 1) detect local conditions and rotate reflectors 3 into the safe mode at night, during high wind, hail or other adverse conditions.

Most damage to reflecting surfaces 8 of reflectors 3 can be prevented by the use of the safe mode under adverse conditions. Note, however, that cavity 11 is not completely sealed. Small gaps between reflectors 3 in safe mode allow for manufacturing variation of reflectors 3 and frame 4. These gaps also allow liquid water between reflectors 3 to drain away in safe mode; if such water froze, rotation of reflectors 3 could be impeded.

Hold-down brackets 114 (shown in detail in FIG. 18) maintain a gap between frame 4 and the mounting surface (roof 110 or ground) to allow an escape path for debris or snow that collects in cavity 11 during normal operation. Safe mode is especially good at melting snow that might collect in cavity 11 of roof-mounted modules 1. Since reflectors 3 are insulating structures, heat conduction to cavity 11 is more closely coupled to the building's interior through the building's roof than to the outside environment.

Building heat tends to melt snow in cavity 11 during nighttime when modules 1 are in safe mode. If cavity 11 is empty when a deep snow occurs, rotation of reflectors 3 pushes snow that has accumulated on surfaces 19 into cavity 11 allowing reflectors 3 to track the sun. Later at night, snow in cavity 11 melts by building heat as noted above. Consequently, modules 1 can operate successfully except in the deepest snowfalls.

Shipping Configuration

Figure 8:
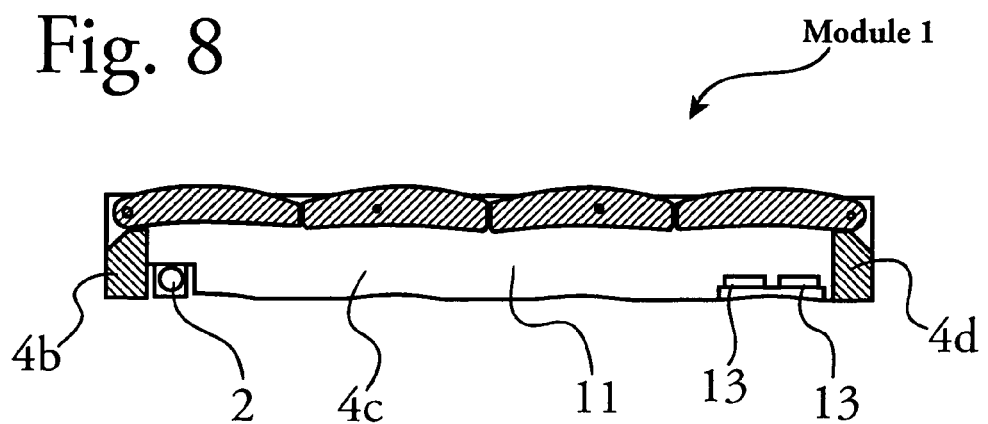
FIG. 8 is a cross sectional view of the present device in its shipping configuration with absorber components stowed internally.

FIG. 8 shows module 1 ready for shipment to an installation site. Absorber 2 and arms 13 are stowed within cavity 11 of frame 4. Recesses cut in frame end members 4a and 4c constrain absorber 2 and arms 13. Brackets with fasteners (not shown) hold the absorber components 2 and 13 tightly to frame 4 during shipping. Absorber 2 is shipped with its fragile vacuum tube assembly facing toward cavity 11 to prevent damage during shipment.

Figure 9:
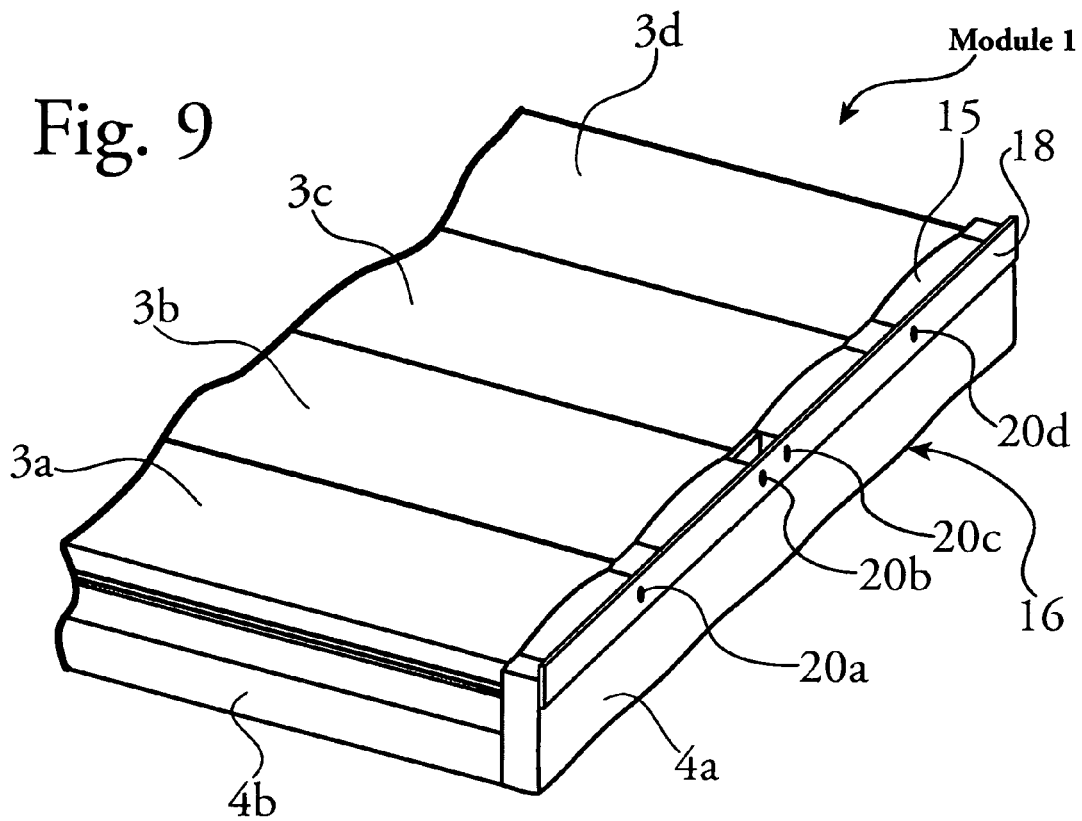
FIG. 9 is a diagrammatic three-dimensional representation of the present device in FIG. 8 in its shipping configuration.

Details of the FIG. 8 shipping configuration are shown in FIG. 9. In the preferred embodiment of module 1, reflectors 3 are prevented from rotating during shipping. One method of preventing rotation is shipping bolts 20 screwed into reflectors 3 through frame ends 4a and 4c. The length of bolts 20 are greater than the thickness of frame end 4a to ensure that the tips of bolts 20 penetrate into holes in reflectors 3. For example, bolt 20d inserted into a through hole in frame end 4a continues into a blind hole in reflector 3d. Since the blind holes in reflectors 3 are a distance from the reflector's rotational axis, reflector 3 is prevented from rotating when bolt 20 is fully inserted. These bolts can also be inserted to lock down the reflectors 3 during other times such as long periods of non-use.

To aid shipment of modules 1, shipping brackets 18 are held by bolts 20 to frame 4a. When a second module 1 is laid atop the module 1 shown with both planes of frame 4 held parallel, brackets 18 prevent the two modules 1 from sliding perpendicular to frame ends 4a during shipment.

To maintain alignment in the other direction, the top surface of frame ends 4a and 4c of one module 1 have the same shape as the bottom surfaces of frame ends 4a and 4c of another module 1. For example, the top surfaces 15 of frame end 4a have a scalloped shape with convex bosses projecting upward. The bottom surfaces 16 of frame ends 4a and 4c have a concave recess of the same curvature and spacing as convex surfaces 15. When one module 1b is placed on another module 1a, these shapes match. When placed one atop the other, the top module 1b is constrained from perpendicular to frame sides 4b during shipment.

Between shipping brackets 18 and mating surfaces 15 and 16, a module 1 will maintain alignment with another during shipping. Once motion in the plane of frame 4 is constrained, many modules 1 can be placed on a shipping pallet and stacked one on another. Shipping straps common in the industry are wrapped around the entire stack to prevent motion perpendicular to the frame 4 plane of modules 1, thereby constraining in-plane motion through packing brackets 18 or interlocking features of frames 4. The stack can be placed in a cargo container and shipped with little damage to modules 1. Note that packing brackets are removed prior to use. Bolts 20 are removed allowing brackets 18 to be removed and freeing rotation of reflectors 3.

Absorber Design

Figure 10:
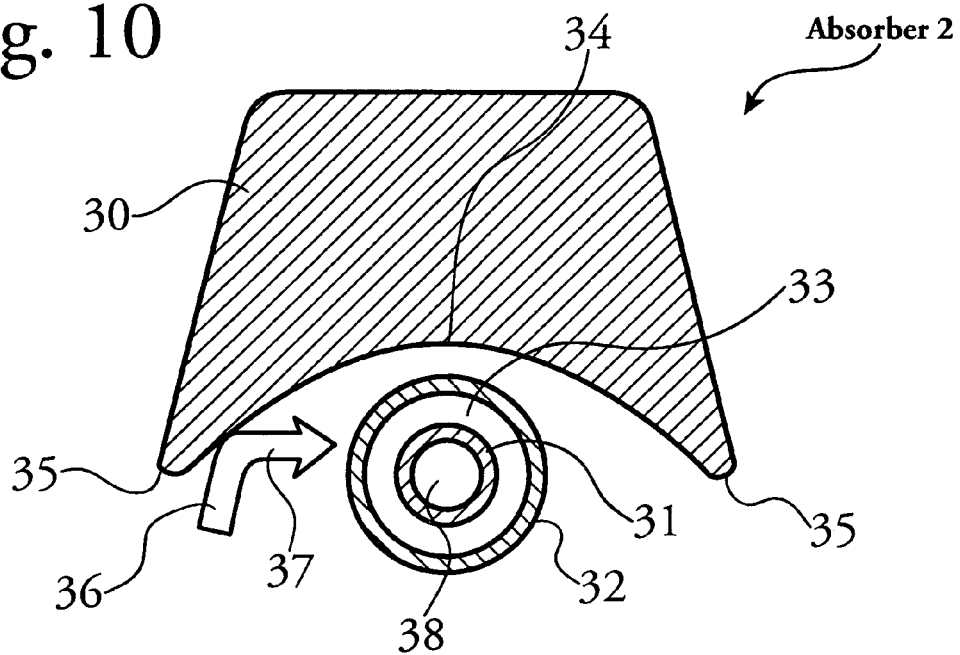
FIG. 10 is a cross sectional view of the absorber component of the present device.

Absorber 2 is shown in cross section in FIG. 10. Solar energy absorbers similar to this are mass-produced in China for solar water heaters. Absorber 2 detail is only described to show how absorber 2 is incorporated into module 1. Absorber 2 has a frame 30 that holds tube 31 and glass vacuum jacket 32. Absorber frame 30 has a concave cavity running its entire length. The cavity surface 34 is made reflective by lining it with a reflecting material such as aluminized MYLAR or BRITECOAT aluminum.

Alternatively, the face sheet comprising surface 34 of frame 30 can be made of a reflecting material. Incoming solar energy 36 reflects from surface 34. Reflected solar energy 37 is directed through vacuum jacket 32 and towards absorber tube 31. Absorber tube 31 is usually coated by a solar energy absorbing surface such as black chrome. Normally, radiation and convection heat loss from tube 31 reduces solar energy absorbed by absorber 2. In the present invention, convection loss is reduced by evacuating space 33 between tube 31 and vacuum jacket 32. Radiation loss is reduced by coating the surface of vacuum jacket 32 with thin film coatings that transmit solar radiation but block lower frequency heat radiation.

In the preferred embodiment, lips 35 of frame 30 form a plane whose surface normal is directed perpendicular to the plane of frame 4 (FIG. 1). The purpose of surface 34 is to capture any solar radiation that has not been absorbed by tube 31 and redirect it back to tube 31. Such back-reflectors 34 are common on solar water heaters sold around the world.

The purpose of absorber 2 is to produce electricity by thermodynamic conversion. When solar energy 5 (FIG. 1) from reflectors 3 is focused onto absorber tube 31 via reflecting surfaces 8 of reflectors 3 and surface 34 of absorber structure 30, fluid 38 within tube 31 is heated and increases in temperature. Fluid 38 can either be a vaporizing one such as water or a non-vaporizing one such as mineral oil.

If a vaporizing fluid 38 is used, fluid 38 vaporizes as it travels through absorber tube 31. The vapor from many modules 1 is combined in manifolds and fed to a thermodynamic engine. If the engine can directly use heat contained in the vapor, the engine choice is usually an engine or a turbine that is coupled with a generator that produces electricity. If a non-vaporizing fluid 38 is used, fluid 38 passes through a heat exchanger that heats a secondary fluid that in turn is used by a thermodynamic engine; the engine is coupled to a generator that produces electricity. Thermodynamic cycles that use heat to power an electrical generator include Rankine cycles and Stirling cycles.

If the fluid 38 in absorber tube 31 is vaporizing, after losing some energy in the thermodynamic engine it is cooled, condenses to a liquid and is recycled back to modules 1. There, a pump pressurizes the liquid and injects it back into absorber tubes 31 where the process begins anew. For a non-vaporizing fluid 38, cooled fluid 38 returned from the heat exchanger is fed back to absorber tube 31 where the process begins anew. In either case, fluid 38 flowing within absorber tubes 31 is usually contained within a closed loop sealed from the atmosphere. As such, its pressure can be either higher or lower than atmospheric pressure. For a vaporizing fluid 38, the pressure within tube 31 is set by the quantity of fluid 38 pumped into tube 31, the solar heat absorbed and the thermodynamic characteristics of the fluid. For a non-vaporizing fluid 38, forced convection heat transfer removes heat from the interior walls of tube 31. The heat transferred to fluid 38 is determined by the quantity of fluid pumped, the solar heat absorbed and the heat transfer characteristics of the fluid.

Fluid 38 is first fed to the thermodynamic engine that converts heat to electricity. As fluid 38 passes through the thermodynamic process, some of its heat is converted to electricity. In a typical thermodynamic conversion, about 20% of the heat is converted to electricity and 10% is unrecoverable heat losses. That leaves about 70% available for other purposes. Heat collected by absorber tube 31 but not converted into electricity can be used for process heating, home heating or hot water heating.

Installation

Figure 11:
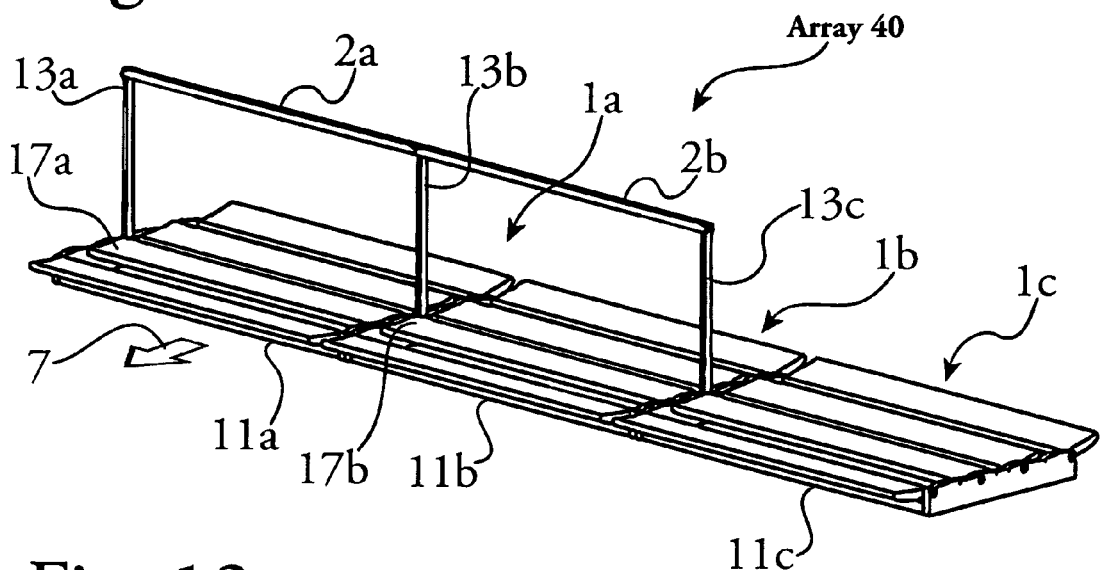
FIG. 11 is a diagrammatic three-dimensional representation of an array of the present devices shown during installation.

Modules 1 are assembled into arrays at the installation site. FIG. 11 shows three modules 1a, 1b and 1c being assembled into array 40. Modules 1 of an array 40 are aligned with each other such that frame sides 11a . . . 11c are coplanar and absorbers 2a and 2b are collinear as shown in FIG. 11. In the preferred embodiment, modules 1 have their front surfaces 11a . . . 11c perpendicular to south direction 7.

During installation, modules 1 arrive at the installation site with their absorber 2 and absorber arms 13 stowed within frame 4. Array 40 starts with one module, such as module 1a in FIG. 11, laid on the roof or ground. Next another module 1b is laid adjacent to first module 1a such that frame sides 11 are coplanar and frame end 4a of module 1a is adjacent to frame 4c of module 1b. Other modules 1 such as module 1c are laid adjacent to the previous module 1 with front sides 11 coplanar in a similar manner.

Once modules 1 of an array 40 are laid out, they are fastened together and aligned by bolting one module to another using bolts similar to bolts 20 (FIG. 9) through shipping bracket 18 bolt holes. This aligns the modules in two dimensions such that surfaces 11 and frames 4 are aligned. Next absorbers 2 are mounted consecutively beginning with first module 1a. Arm 13a is mounted into slot 17a of module 1a and arm 13b is mounted into slot 17b of module 1b. Absorber 2a is placed loosely between arms 13a and 13b. The process of adding an arm 13 and a reflector 2 is repeated for each module 1 in array 40. FIG. 11 shows the process after arms 13a, 13b and 13c have been erected to support absorbers 2a and 2b.

Figure 12:
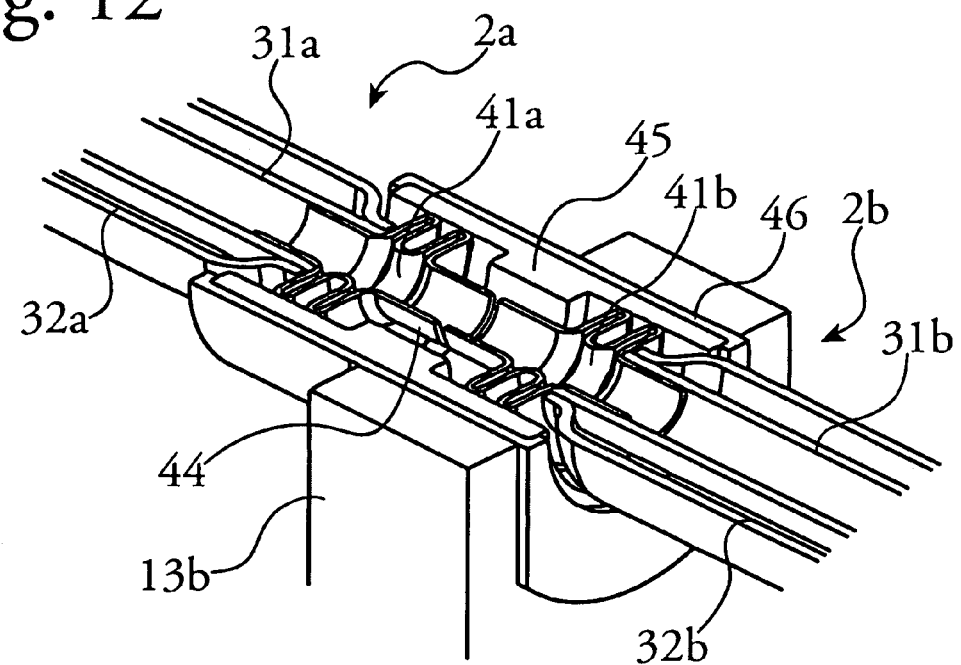
FIG. 12 is a cutaway three-dimensional representation of joint between absorber components in an array of the present devices shown in FIG. 11.

Once absorbers 2 have been aligned atop arms 13, their absorber tubes 31 are attached. FIG. 12 shows the joint between two reflectors 2a and 2b supported by arm 13b as shown in FIG. 11. Bracket 46 holds liner 45 in a recess on the top of arm 13b forming a cradle that supports both absorber 2a and 2b. Absorber reflectors 30 are not shown for clarity. Each absorber tube 31 has a flexible coupling 41 at each of its ends. Coupling 41 allows small angular and translational displacements between absorbers 2a and 2b due to settling of modules 1 after installation. Ideally, flexible couplings 41 are made from a material that has a low yield strength and is brazed or welded to the ends of absorber tubes 31. Low yield strength materials allow flexible couplings 41 to deform slightly without breaking. Austenitic stainless steel (e.g., SS 303) is an example of material with a low yield strength.

The cavity in liner 45 holds flexible couplings 41 of absorbers 2a and 2b. Sleeve 44 is slipped onto absorber 2b (composed of tube 31b, vacuum jacket 32b and flexible coupling 41b) before it is laid onto the cavity of liner 45. After the opposite end of absorber 2b is placed atop arm 13c (FIG. 11), sleeve 44 is bonded to flexible couplings 41a and 41b. The bonding can be an adhesive such as epoxy for low temperature applications or can be a metallic bond (i.e., soldering, brazing, welding) for higher temperature applications.

When the bonding is completed, absorber tube 31a is bonded to absorber tube 31b through sleeve 44. The joint allows both gaseous and liquid fluids to flow from the absorber 2 of one module 1 to the absorber 2 of an adjacent module 1. Under normal circumstances, the connection of one module to the next is permanent; it requires no attention for the life of array 40. However, array 40 can still be disassembled by reheating or breaking sleeve 44 bond should repair or maintenance be required. Note that for south facing modules 1, during mornings and evenings, some of the reflected solar energy 5 (FIG. 1) does not reflect into its associated absorber 2. Rather, it reflects onto an adjacent absorber in array 40, so long as absorbers 2 are collinear. That is, the solar energy 5 impinging on module 1b of array 40 will be reflected onto adjacent module 1a during mornings and afternoons. Except for a small amount of shadowing by arms 13, most of the reflected energy 6 from a reflector 3 is absorbed by absorber 2 of either the same module 1 or an adjacent module 1.

Figure 13:
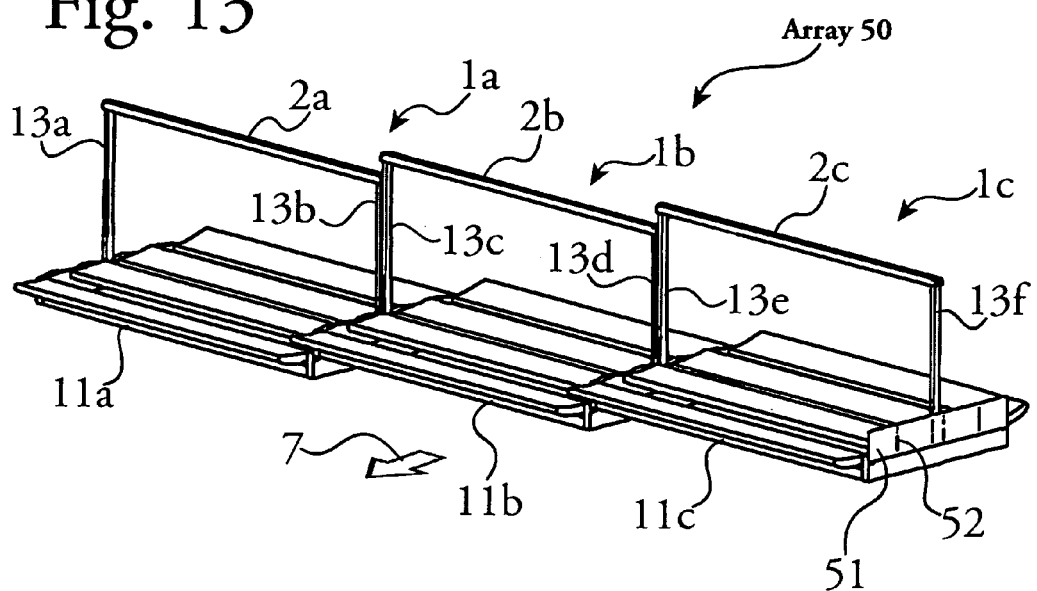
FIG. 13 is a diagrammatic three-dimensional representation of an array of the present devices installed on a sloped surface.

In some applications, the surface on which modules 1 are placed may not be level, for example if an array 50 (FIG. 13) is sited on sloped land. In array 50, surfaces 11 must be coplanar for the reflected energy 6 of one module 1 to be properly reflected to adjacent modules 1. For crosswise slope, modules 1 can use adjustable feet similar to brackets 10 (FIG. 4) to align modules 1 in an array 50 to ensure that surfaces 11 are coplanar.

Lengthwise slope direction uses bracket 51 that engages the holes used for shipping brackets 18 (FIG. 9). In the preferred embodiment, bracket 51 has pre-drilled holes 52 that engage bolts fastening one module 1 to an adjacent one. By choosing the set of holes in bracket 52 that levels a module 1, various surface slopes can be accommodated.

For stronger absorber support in a sloped surface installation, two absorber arms 13 are used. For example, module 1a has arms 13a and 13b supporting its associated absorber 2a. Similarly, module 1b has arms 13c and 13d supporting its absorber 2b. Sloped installations also require an extension tube and elbows in addition to couplings 41 (FIG. 12) to connect the absorber tube 31 of one module 1 to the absorber tube 31 of an adjacent module 1.

Motor Detail

Figure 14:
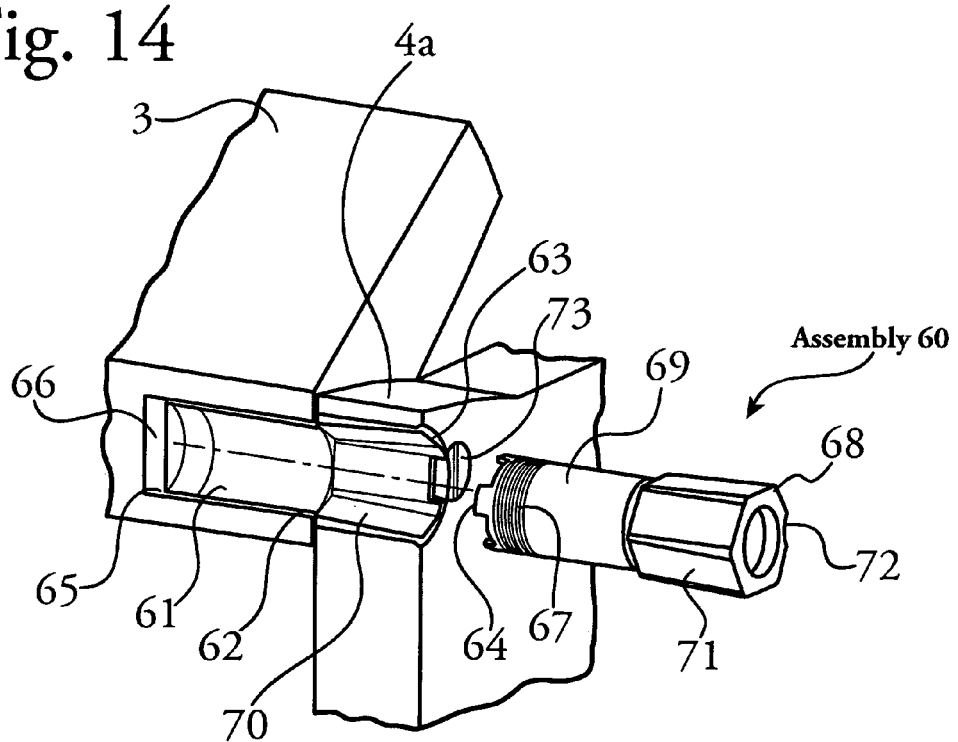
FIG. 14 is a cutaway three-dimensional representation of the motor assembly being inserted into the reflector of the present device.

FIG. 14 is a cross section of module 1 taken through axle 9b (FIG. 2) showing details of reflector 3 rotatation. Reflector 3 and frame end 4a are shown in cutaway. Assembly 60, composed of flexible coupling 67, motor 69 and holder 68, is shown before assembly for better clarity. Assembly 60 slides through frame end 4a and into the cavity in reflector 3 to complete the assembly. After insertion of assembly 60, locking fastener 73 is rotated a half turn engaging land 72 on holder 68 to lock assembly 60 in place. Reflector insert 66 is embedded into the structure of reflector 3. The exterior surface of insert 66 is bonded to the interior surface of a cavity in reflector 3 having the same dimensions to assure that torque applied to insert 66 is transmitted without failure to reflector 3.

Inside insert 66 is bearing 61. In the preferred embodiment, bearing 61 is a sleeve bearing made of a low wear, low friction material such as TEFLON-impregnated fiberglass or ultra high molecular weight polyethylene (UHMWPE). When assembly 60 is inserted into bearing 61, the housing of motor 69 has close mechanical tolerances with the interior cylindrical body of bearing 66 allowing reflector 3 to move smoothly about the rotational axis of assembly 60. Bearing 61 has a flange 62 that separates reflector 3 from frame end 4a and lowers the friction between these two components during rotation of reflector 3. Flange 62 also keeps debris from entering the space between reflector 3 and frame end 4a.

When assembly 60 is inserted into bearing 61, the outer surfaces of motor holder 68 engage the inner surfaces of frame insert 63. These surfaces have the same shape and, when engaged, prevent rotation between assembly 60 and frame end 4a. Insert 63 is bonded into a cylindrical cavity in frame 4a to assure that torque applied to insert 63 is transmitted without rotation to reflector 3. Similarly, the exterior of motor 69 is bonded to the interior of holder 68 to be sure motor 69 transmits torque without relative rotation between the two components.

In the preferred embodiment, holder 68 is hexagonal; having six sides 71 that engage the six sides 70 of the interior of insert 63. The exterior sides 71 of holder 68 and the interior sides 70 of insert 63 are tapered toward reflector 3. That is, the hex shape on the frame 4a end of holder 68 is smaller than the hex shape on the reflector 3 end of holder 68. When assembly 60 is assembled into insert 63, surfaces 71 of holder 68 engage surfaces 70 of insert 63 to assure that torque is transmitted from frame 4a to motor 69 without backlash (faithful motion transmission during motor reversal).

Flexible coupling 67 is attached to and rotates with the shaft of motor 69. Tines 64 at the end of coupling 67 have the same exterior shape as the interior shape of recesses 65 in insert 66. When assembly 60 is assembled into reflector 3, tines 64 engage recesses 65. Motor 69 rotation is transmitted to reflector 3 via tines 64 of coupling 67 through recesses 65 of insert 66.

Flexible coupling 67 has two purposes. First it transmits rotational motion from motor 69 to reflector 3 despite slight variations in the dimensions of motor 69, bearing 61 and insert 66. Second, flexible coupling 67 has axial compliance and its no-load length is longer than its in-service length. When assembled and locked into place by locking fastener 73, axial compliance of flexible coupling 67 forces tines 64 into recesses 65.

Tines 64 and recesses 65 are tapered toward the reflector end of assembly 60. The spring loading of tines 64 into recesses 65 drives the tapered surfaces into engagement, assuring that rotational motion is transmitted from motor 69 to reflector 3 without backlash (faithful motion transmission during motor reversal).

Note that flexible coupling 67 assures that only torque loads are transmitted through the bearings and shaft of motor 69. Force loads such as vertical or horizontal wind loads on reflector 3 are transmitted through insert 66 and bearing 61 directly to the outer housing of motor 69. In the preferred embodiment, motor 69 is a planetary gearmotor whose bearings might not withstand large radial or thrust loading without damage. Flexible coupling 67 shifts radial and thrust loads onto bearing 61, giving a longer life to motor 69 bearings.

Assembly 60 is easily removed for repair and maintenance. Rotating locking fastener a half turn allows the entire assembly 60 to be removed from module 1. Since assembly 60 captures reflector 3, removal of assembly 60 also frees one end of reflector 3. Removing a similar assembly 60 at the other end of reflector 3 frees reflector 3 for removal or repair.

Other embodiments of module 1 have alternative methods of rotating reflectors 3. Instead of using an individual rotation assembly 60 on each reflector 3, reflectors 3 can alternatively be ganged together by attaching a drum to each reflector and wrapping a common cable around each drum. When a common motor rotates the drum of one reflector 3 a certain angle, the cable moves and rotates other reflectors 3 the same angle.

For sun tracking, the ganged drum method works quite well. However, in the preferred method of off-center axle location of reflector 3 (FIG. 3), reflectors 3 rotate in different directions during safe mode. Having accurate sun tracking, safe mode protection of reflecting surfaces of module 1 and off-center axle 9 location requires a complex mechanism to use ganged rotation. Individual rotation of each reflector 3 by its own rotation assembly 60 avoids these complexities.

Photovoltaic Absorber

Figure 15:
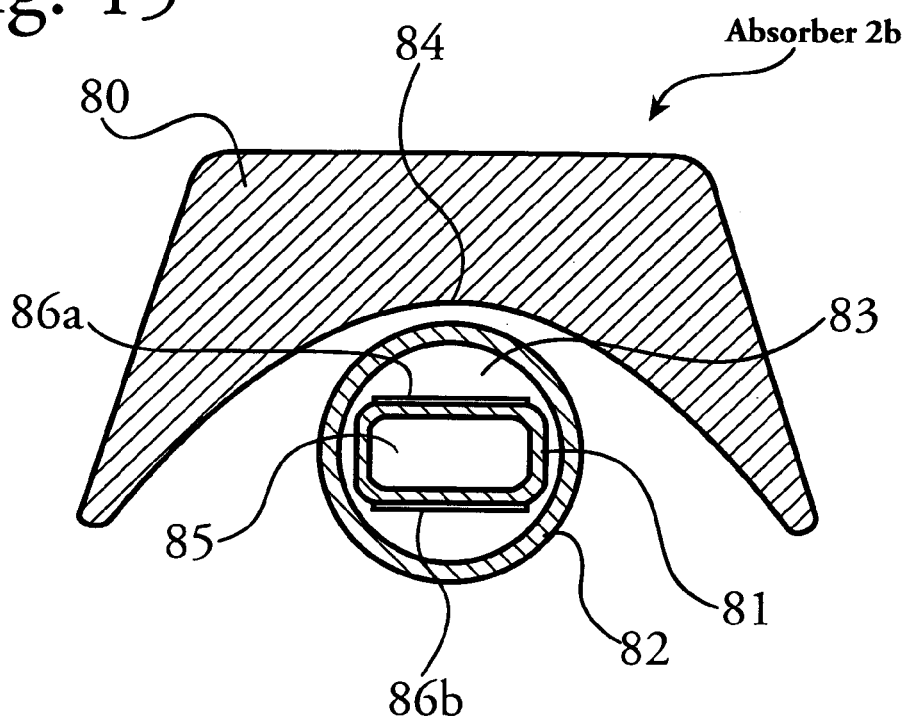
FIG. 15 is a cross sectional view of an absorber component of the present device that produces electricity using photovoltaic cells.

An alternative absorber 2 to the one shown in cross section in FIG. 10 is shown in FIG. 15. Photovoltaic absorber 2b has many components with similar function as those in absorber 2, FIG. 10. Frame 80 has a similar function as frame 30 (FIG. 10): supporting absorbing tube 81 and evacuated tube 82. Reflecting surface 84 reflects solar energy in a similar manner to surface 34 (FIG. 10). Absorbing tube 81 absorbs solar energy directed at it in the same way as tube 31 (FIG. 10). Evacuated tube 82 prevents heat loss from absorber tube 81 much as evacuated tube 32 prevents heat loss from absorber tube 31 (FIG. 10). Both absorbers 2 and 2b have an evacuated region between the evacuated tube and the absorbing tube (33 in FIG. 10 83 in FIG. 15).

However, absorber 2b has photovoltaic cells 86 bonded to the flat surfaces of tube 81. Photovoltaic cells 86b on the bottom of tube 81 are exposed to direct reflection of solar energy 5 from reflectors 3. Top cells 86a are exposed to a lesser solar flux reflecting from surface 84 of frame 80.

Photovoltaic cells 86 are bonded to flat surfaces on absorber tube 81 giving good thermal contact with tube 81. A fluid 85 is pumped through the interior of tube 81 to carry away excess heat and keep cells 86 cool for efficient operation. Fluid 85 can be a liquid such as water or mineral oil that removes heat by forced convection from the interior surfaces of tube 81. Fluid 85 can also be a fluid such as ammonium or organic fluid that vaporizes at a low temperature. In this case, fluid 85 vaporizes from the inner surface of tube 81 removing heat from cells 86 to fluid 85 by the heat of vaporization. The purpose of photovoltaic cells 86 is to convert reflected solar energy 6 directly to electricity via the photovoltaic process. Photovoltaic cells 86 have conversion efficiencies generally in the teens (13% to 19%). New multi junction processes have improved conversion efficiencies to 40%. Thermodynamic conversion efficiencies (those using absorber 2 instead of absorber 2b) have efficiencies in the same range: 13% to 40%.

However, thermodynamic conversion efficiency drops precipitously as the size of the thermodynamic engine is reduced. For residential installations (systems of less than 20 kW), photovoltaic conversion is the better choice. For commercial and industrial installations (systems greater than 100 kW), thermodynamic conversion is the better choice. Between 20 kW and 100 kW, the choice depends upon the efficiency of photovoltaic cells 86 used and other considerations.

Certain photovoltaic cell materials, such as those made from Gallium Arsenide (GaAs) or copper indium gallium diselenide (CIGS), degrade when exposed to moisture or oxygen. These photovoltaic cells can be made in strips on a flexible backing. Their high efficiency has made them the choice for space-based power generation where they are not exposed to moisture or oxygen. In absorber 2b, photovoltaic cells 86 are enclosed in vacuum environment 83, eliminating degradation due to moisture and oxidation. Hence photovoltaic materials such as GaAs or CIGS can be used to advantage in module 1.

In absorber 2, heat collected by absorber tube 31 but not converted into electricity could be used for process heating, home heating or hot water heating. Similarly in photovoltaic conversion by absorber 2b, not all of the heat absorbed by absorber tube 81 is used in the conversion. Again about 20% is converted to electricity and 10% is lost as unrecoverable heat, leaving 70% available for heat use.

Such "waste heat" is valuable: it can offset the cost of modules 1 by supplying heat as well as electricity. In absorber 2b, fluid 85 absorbs the heat required to keep photovoltaic cells 86 cool. When fluid 85 is pumped through a heat exchanger, the heat exchanger output can heat a house, hot water or process heat for factories. Again, fluid 85 is usually confined to a closed loop where it does not interact with other fluids except through heat exchanger walls.

Fabrication

In the preferred embodiment, major components of module 1 such as reflectors 3a . . . 3d (FIG. 1), frame components 4a . . . 4c (FIG. 1), absorber frame 80 (FIG. 15) and absorber arm 13 (FIG. 2) are fabricated in the same way. Each component can be approximated by a beam that has thin sheets bonded to a lightweight core. This construction, called "sandwich panel" construction, is one of the most efficient structures known for flat beams like reflectors 3 and frame 4 of module 1. "Efficient" in this context means that for a given load, the beam is lighter in weight (and lower in cost) than other beam designs.

In sandwich panels, bending loads applied to the beam are resisted by stresses in the beam's thin sheets called face sheets. The face sheet on one side of the structure develops tension stresses and the opposite face sheet develops compressive stresses forming a moment that counters the applied load. For a given beam load, the farther apart are the face sheets from one another, the less are the internal tension and compression stresses in the face sheets. The core keeps the two face sheets apart and also prevents local buckling of the compressed sheet.

Figure 16:
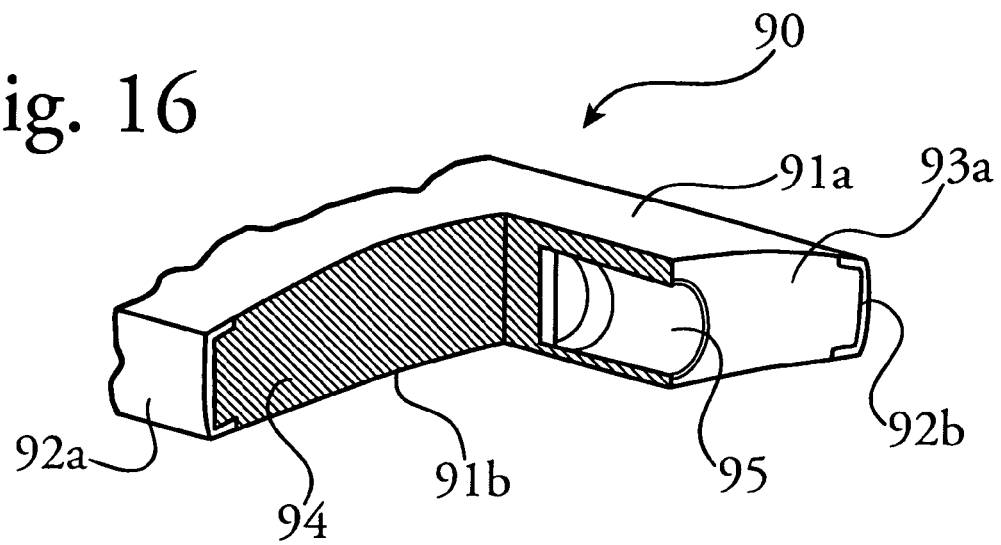
FIG. 16 is a cutaway three-dimensional representation showing the internal structure of a typical double wall component of the present device.

Panel 90 is shown in cutaway in FIG. 16 to represent a typical sandwich panel component. Here reflector 3 is shown as an example of a generic sandwich panel. Other module 1 components such as frame 4a . . . 4d, absorber frame 80 and absorber arms 13 are also made of sandwich panels. Face sheet 91a is one face sheet of panel 90; face sheet 91b is the other face sheet. Core 94 keeps sheets 91a and 91b apart to resist bending loads. Face sheets 91 are bonded to core 94 to prevent local buckling of the compression face sheet 91.

Core 94 can be made from any number of lightweight materials from plastic foam to "honeycomb". Plastic foam is made by injecting gas bubbles into either thermoplastic or thermoset materials in their liquid state and letting them harden into foam. Honeycomb is made from thin sheets of lightweight material fabricated into adjacent hexagonal cells; the thin sheets are usually metal, paper or composite material. In the preferred embodiment, core 94 is either polyethylene foam or paper honeycomb. In addition to face sheets 91 and core 94, a strong sandwich panel also needs perimeter frame members 92 and 93 to more effectively resist bending loads. Perimeter frame 92a and 92b run the length of panel 90. They are adhesively bonded to face sheets 91 and core 94 along their entire length. Perimeter frame 93 is composed of perimeter frame member 93a and a mirror image of member 93a at the opposite end of panel 90 (not shown). Frame members 93 are bonded to face sheets 91, to perimeter frame member 92 and to core 94.

In most sandwich panel components, inserts such as motor insert 66 (FIG. 14) must be embedded into the structure. Insert 95 represents a generic insert in sandwich panel 90. After the adhesive that bonds components 91, 92, 93 and 94 together has set, the outer shape of insert 95 is cut into panel 90; the cut cavity usually penetrates through perimeter frame member 92 or 93 and then into core 94. Next insert 95 is coated with adhesive and inserted into the cavity in panel 90. The adhesive attaches insert 95 to both the perimeter frame 92 or 93 and the core 94 to best distribute stresses induced by motor assembly 60 (FIG. 14).

For module 1, the maximum load condition is wind loading. Module 1 components such as reflectors 3, frame 4 and absorber 2 can withstand these loads most efficiently using sandwich panel construction. The materials used in generic panel 90 must not only be low in weight, but also low in cost. In the preferred embodiment, face sheets 91 and perimeter frame members 92 and 93 are composed of fiber reinforced plastic (FRP), also called fiberglass. Other candidate materials such as aluminum and carbon fiber are usually too costly to produce a solar module 1 with short payback. When using fiberglass as the material for face sheets 91 and perimeter frame 92, fibers can be placed in a direction that best resists the applied loads. When fiberglass fibers are straight and in the direction of the stress vector, they are strongest. To reduce the weight and cost of fiberglass face sheets 91 and perimeter frame members 92, fibers are directed in the direction of maximum stress under high loading conditions.

For example, under wind loading of reflectors 3, most face sheet 91 stresses are in the longitudinal direction (i.e., in the direction of the reflector 3 long axis). To best resist wind-induced bending moments in reflectors 3, fibers in reflector 3 face sheets 91 and perimeter frame members 92 are laid in the longitudinal direction.

However, reflectors 3 must sustain other loads than just wind-induced bending moments. To resist these other loads without failure, longitudinal fibers are combined with woven fiberglass cloth into the same face sheet 91. The longitudinal fibers resist expected wind-induced bending loads while the cloth resists loads of unknown direction. The combination of directionally placed fibers and omni-directional cloth makes a composite panel 90 that can withstand most in-service loads. By carefully analyzing expected loads and placing fibers or cloth in the direction that will best resist those loads produces the lowest cost component.

Figure 17:
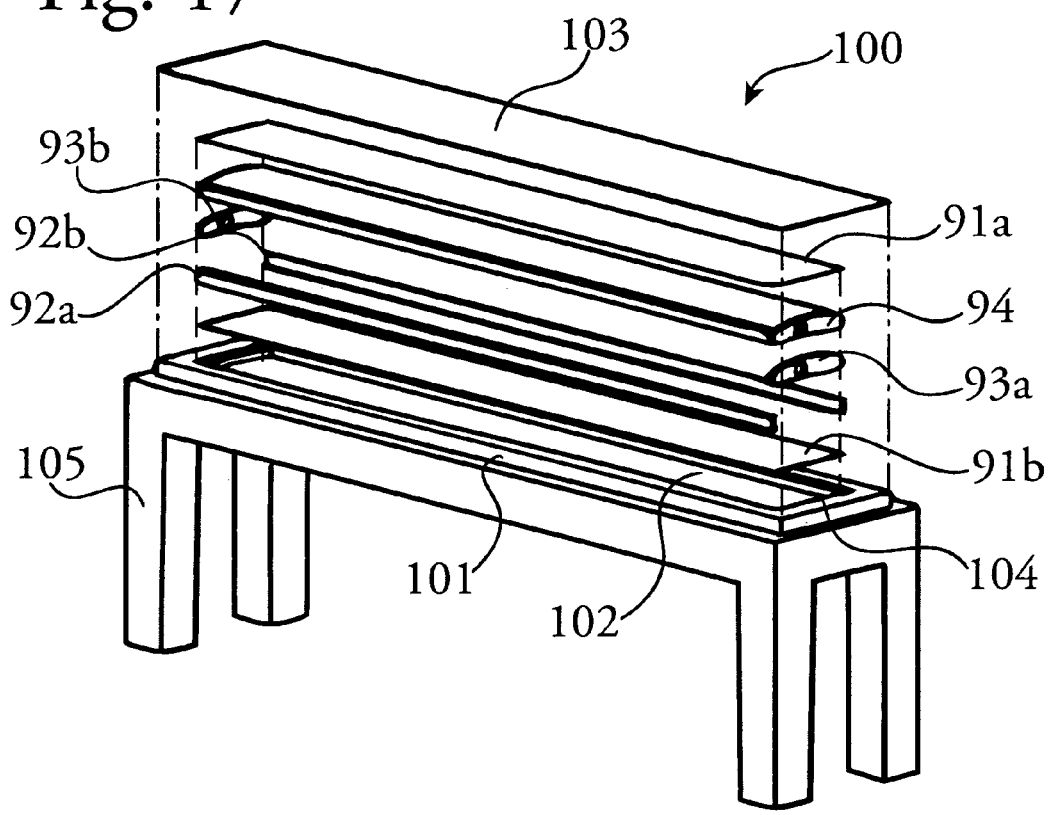
FIG. 17 is a diagrammatic three-dimensional representation showing the assembly of a reflector of the present device.

Fabrication of a typical panel 90 is shown in FIG. 17. Assembly 100 is composed of rigid form 101, components 91, 92, 93 and 94 of a sandwich panel 90 (FIG. 16) and cover 103. Assembly table 105 supports assembly 100 during the assembly process. Assembly begins when panel 90 components 91, 92, 93 and 94 are sprayed with an adhesive on those surfaces that are to be mated. Next panel 90 components are placed in cavity 102 of form 101. The tolerances between cavity 102 and panel 90 components are small enough so that panel 90 components are held in orientation and location as the assembly proceeds.

Once panel 90 components (i.e., components 91, 92, 93 and 94) are placed in cavity 102, a thin flexible cover 103 is placed over the panel 90 components and form 101. The edges 104 of form 101 are flat and form a seal with cover 103 around the entire periphery of form 101. As the air pressure within cavity 102 is reduced, cover 103 presses components 91, 92, 93 and 94 together with atmospheric pressure. For a pressure of, say, 1 pound per square inch in cavity 102, the bonding forces on panel 90 components can be over 10,000 pounds. While the adhesive cures, panel 90 components stay under lower pressure inside form 104 for 30 minutes or more.

The value of this technique is that assembly 100 can be stored elsewhere during curing. Once the pressure in cavity 102 is lowered, panel 90 components, cover 103 and form 101 make a rigid structure. Assembly 100 can be moved to a curing rack where the adhesive can cure while another assembly 100 is built on table 105. After curing, air is bled into cavity 102 to remove the bonding forces. Cover 103 is removed and the completed panel 90 is removed from form 101. Note that both form 101 and cover 103 can be reused for another panel 90 assembly.

While frame components 4 and absorber components 2 and 13 of module 1 are flat, reflectors 3 are not. Reflector 3 surfaces need to be either concave such as reflecting surface 8 (FIG. 3) or convex such as reflector 3 outer surfaces 19 (FIG. 6). Surfaces 8 must be concave to focus solar energy 5 on absorber 2. Further, surfaces 8 and 19 are curved to strengthen reflector 3.

To fabricate concave surfaces 8, cavity 102 of form 101 has a convex bottom that matches the concave shape required for reflector 3. Face sheet 91b (FIG. 17) is flat when it is placed into cavity 102. However, on lowering the pressure within cavity 102, atmospheric pressure acts through cover 103, face sheet 91a and core 94 as it presses face sheet 91b into cavity 102, forcing face sheet 91b to conform to the convex shape of cavity 102. As adhesive between face sheet 91b and core 94 cures, concave surface 8 (FIG. 3) is held to its proper shape for focusing solar energy 5 onto absorber 2. Similarly, face sheet 91a (FIG. 17) is flat when laid onto the top of core 94 during fabrication of assembly 100. Atmospheric pressure, acting through flexible cover 103, forces face sheet 91a to conform to the convex shape of the upper surface of core 94. After curing, face sheets 91a and 91b are adhesively bonded to core 94 and to perimeter frame members 92 and 93, forming a rigid structure with the proper shape to function as reflector 3.

Attachment

Figure 18:
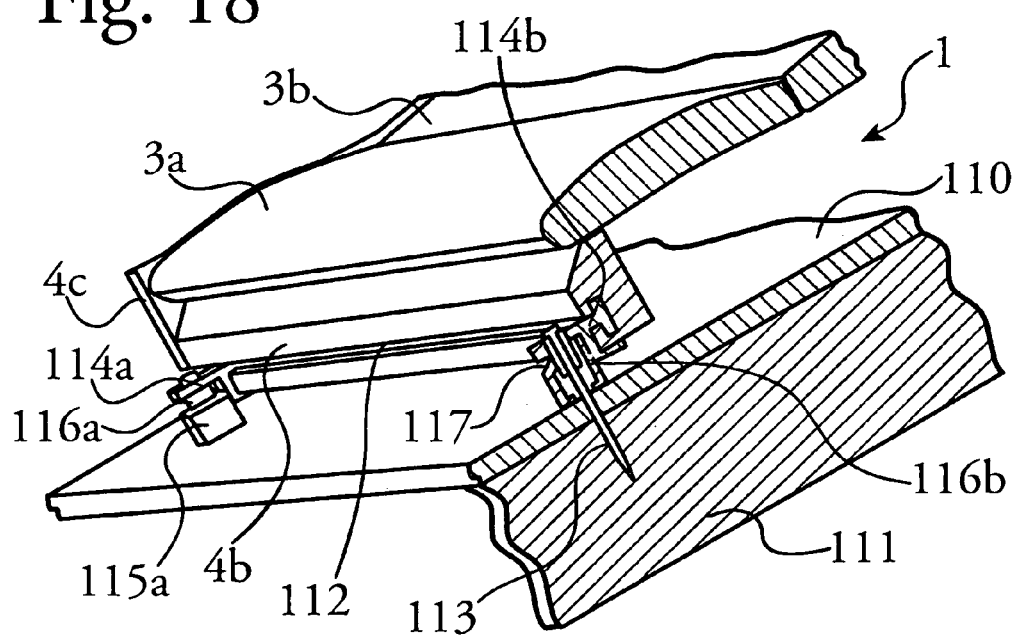
FIG. 18 is a cutaway three-dimensional representation showing mounting hardware and installation details of the present device.

FIG. 18 shows a cutaway view of the preferred method of attaching module 1 to a roof. The cutaway view cuts through module 1, roof 110, roof rafter 111 and hold-down bracket 114b. In an industrial installation, a metal roof support member replaces wood rafter 111. Hold-down brackets 114a and 114b have a T-shaped boss that closely matches the internal shape of T-slot 112. Slot 112 runs the length of frame side 4b and continues through frame ends 4a (not shown) and 4c. As such, each slot 112 runs the entire length of module 1. Another T-slot 112 runs the length of frame side 4d (not shown) on the other side of module 1.

During installation, hold-down brackets 114 are moved along slot 112 on frame 4 until they are above the center of a rafter 111. Usually brackets 114 are placed near the corners of module 1 so each bracket more evenly shares wind loads on module 1. Sealant is forced into hole 117 of bracket 114 to seal roof 110 at the point of roof 110 penetration to assure that no leakage occurs through the bolt 113 hole. Lag bolts 113 are screwed through hole 117 of hold-down brackets 114 into rafters 111 to temporarily secure module 1 to the roof. Hole 117 in bracket 114, nut 116 and foot 115 is larger than bolt diameter 113 to allow for installation variability of the position of lag bolt 113 through roof 110 and into rafter 111.

Hold-down brackets 114 have feet 115 that press against roof 110. Between hold-down bracket 114 and foot 115 is nut 116 that screws into threads on bracket 114. Nut 116 fits within a cylindrical recess in foot 115. Rotation of foot 115 is prevented by the engagement of its flat side with the flat side of bracket 114. Rotating nut 116 clockwise increases the distance between bracket 114 and foot 115. Rotating nut 116 counterclockwise decreases the distance between bracket 114 and foot 115.

In the preferred embodiment, components such as brackets 114, feet 115 and nuts 116 are made by injection molding. Since these components are under stress for long duration, the injection-molded parts are fiber-reinforced to prevent creep or fracture over long periods. Short lengths of fiber are combined with a thermoplastic or thermoset material to produce the fiber reinforced part in an injection molding cavity.

During installation, modules 1 must have their frame sides 4b coplanar in order for reflected solar energy 6 (FIG. 1) to reflect into an adjacent absorber 2 when modules 1 are deployed in an array 40 (FIG. 11). Since roofs 110 are never quite flat, nuts 116 provide a means for adjusting the reflected solar energy 6 into an adjacent module 1. Once adjusted for coplanarity of sides 4b, tightening bolt 113 further into rafter 111 locks that end of module 1 to rafter 111 at the position set by the location of bracket 114 on T-slot 112 and the amount of rotation of nut 116 onto bracket 114. If modules 1 need to be removed for repair of roof 110, removal of lag bolts 113 from each bracket 114 allows that module 1 to be removed.

Note that frame side 4b need not be perpendicular to rafters 111 as shown in FIG. 18. By sliding brackets 114 to different locations along T-slot 112, different rafter 111 spacing and different installation angles between frame side 4b and rafters 111 can be accommodated.

Electrical Circuitry

Figure 19:
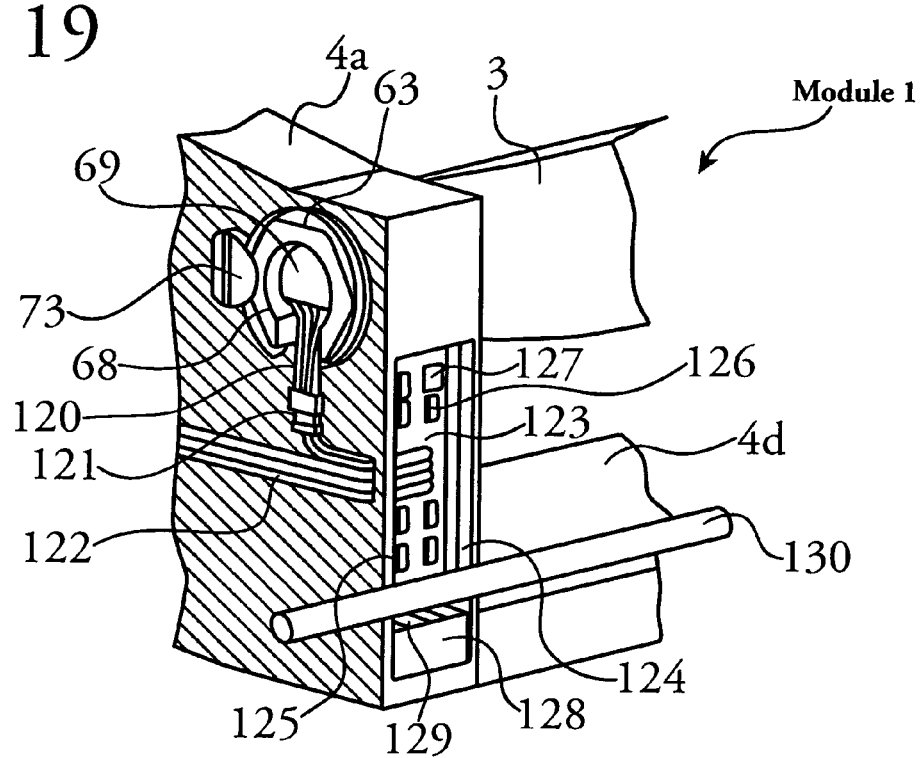
FIG. 19 is a cutaway three-dimensional representation showing the electronic wiring of the present device.

FIG. 19 shows a cutaway of the corner of module 1. The section is through frame end 4a and shows the motor wiring. As noted previously, motor 69 is held by holder 68, which in turn resides in frame insert 63 that is bonded into frame end 4a. Motor 69 and holder 68 are held in place by locking fastener 73. An internal optical encoder is built into motor 69 and cannot be seen in FIG. 19; it returns a signal indicating the position of motor 69. Motor 69 has several wires 120 connected to it. In the preferred embodiment shown, two wires are the motor drive wires and two are motor encoder wires. Signals in wires 120 continue through connector 121. Connector 121 allows motor assembly 60 (FIG. 14) to be removed for replacement or repair. Wire harness 122 includes similar wiring from the other three motors 69 in module 1 plus signal wiring from sensors. Harness 122 is embedded within the structure of frame end 4a during its sandwich panel fabrication as in FIG. 16.

Wires from harness 122 terminate on printed circuit board 123 located in cavity 124 at the end of frame end 4a. Circuit board 123 has electronic components such as motor drivers 125, registers 126 and microcontroller 127 as well as other devices required for the proper functioning of module 1. Connected to circuit board 123 is supply wire 130 that either supplies power to the circuits, removes photovoltaic power or both depending on configuration. Supply wire 130 is connected to each of the modules 1 in an array 40 (FIG. 11). Cavity 124 has a cover (not shown) that excludes moisture and dust from the electronic components within.

Also included within cavity 124 is a battery holder 128 containing batteries 129. These batteries 129 are rechargeable ones that are kept charged by photovoltaic sources on module 1 (when a photovoltaic absorber 2b (FIG. 15) is used), by supply wire 130 or by a separate photovoltaic panel on module 1 (not shown). Battery backup is needed to be sure that module 1 can function (for example, to open or close reflectors 3) even if the external power fails.

In the preferred embodiment, encoder signals from motors 69 consist of two single-bit digital signals. The encoder sends a brief voltage pulse down wire 120 each time motor 69 rotation interrupts the optical beam of the encoder. A second encoder wire 120 has a similar voltage pulse when motor 69 rotation interrupts a second optical beam of the encoder; the pulse is sent at a different motor 69 angle than the first wire 120.

Analysis of these two signals by microcontroller 127 or by other digital circuits determine the direction of rotation, the rate of rotation and the absolute position of reflector 3. Since the motor 69 is a gearmotor with a preferred gear ratio of 4000:1, even two one-bit signals produce high-resolution angular information.

The other two wires 120 drive motor 69. One is the current return path and the other is the voltage produced by motor driver 125, typically in the range between 0 to 6V. DC gearmotor 69 is commanded by microcontroller 127 to produce a particular rotation speed during sun tracking. Encoder signals on wires 120 determine if the position of reflector 3 is correct. If not, microcontroller 127 increases the voltage to motor 69 thereby increasing its speed to correct the error in reflector 3 angle. Motor 69 and its internal encoder together with microprocessor 127 form a servo controller common in motion control systems. The voltage required by motor 69 is an indication of how much torque is required to rotate reflector 3.

If reflector 3 meets an obstruction such as a fallen branch that prevents proper reflector 3 rotation, the voltage commanded by microcontroller 127 will increase, signaling a higher than normal torque. Higher than normal torque signals are also an indication that a motor 69 is failing, that the friction of a bearing 61 (FIG. 14) has increased or that the wind load on a reflector 3 has increased. Each of these aberrant conditions has its own torque and rotation signature. For example, a fallen branch has a torque signature with a quick rise in torque. A failing bearing has a different signature, a slowly increasing torque with time. Microcontroller 127 can use various internal software programs to identify and fix error found by torque signatures.

Microcontroller 127 can also signal a supervisory computer that a particular module 1 is not operating properly. High frequency signals on supply wire 130 allows module 1 to communicate with a supervisory computer as well as other modules 1. Alternatively, wireless circuits connected to microcontroller 127 can communicate with a supervisory computer and modules 1.

The torque and angular position signals from an ensemble of many motors 69 or many modules 1 can indicate circumstances that can not be determined by a single motor 69 or single module 1. For example, if ambient wind increases to the point where modules 1 should be put in their safe mode, a more reliable closing indication is based on torque signatures from an ensemble of many modules 1 rather than from a single module 1. In addition to ensemble averaging, histories of torque and angular position are a valuable tool in recognizing certain faults. For instance, if a module 1 has been successfully tracking the sun for several weeks, any deviation from that schedule beyond the expected sun position changes indicates deviant tracking.

Figure 20:
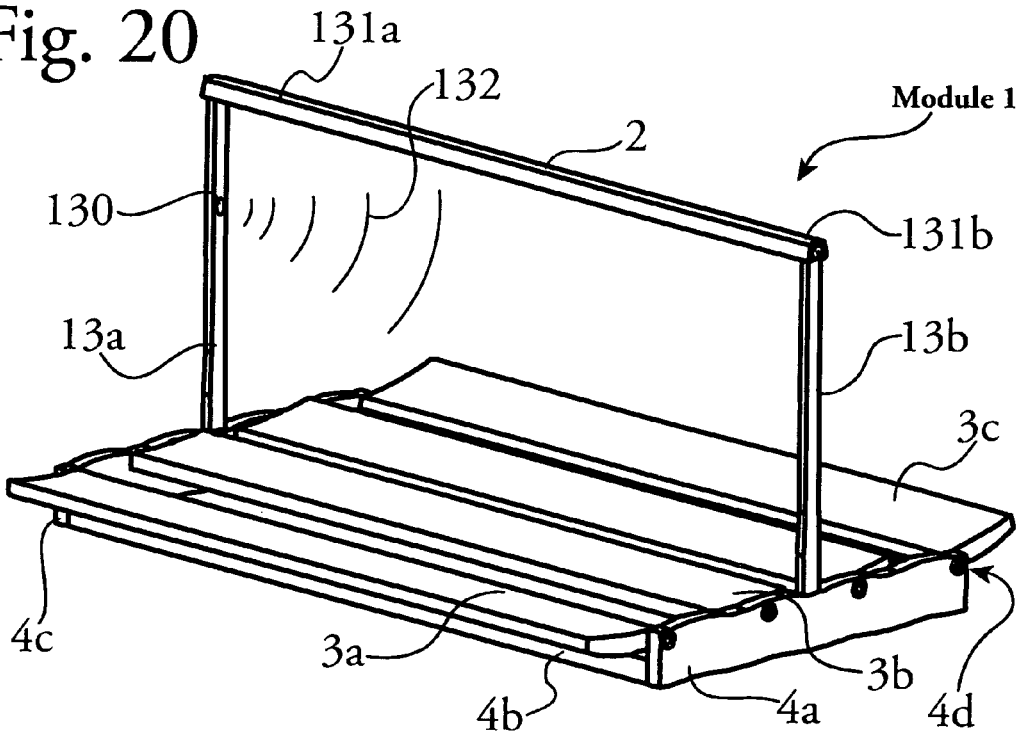
FIG. 20 is a diagrammatic three-dimensional representation showing the location of sensors on the present device.

Besides the torque and angular position signals from motor 69, other sensors in module 1 can further diagnose aberrant conditions. FIG. 20 shows module 1 in its deployed state with absorber 2 in place above frame 4a . . . 4d. Acoustic sensor 130 and temperature sensors 131 are deployed in module 1 to detect aberrant conditions and to optimally adjust the angular position trajectories of reflectors 3 to absorb the most solar energy 5 falling on module 1.

Acoustic sensor 130 is used as a safety device to detect intruding objects. Sensor 130 sends a pulse of high frequency sound waves 132 from arm 13a toward arm 13b. Sensors similar to sensor 130 are used for automatic door openers and intrusion detectors. Signal wires for sensor 130 (not shown) are routed through arm 13a with electrical connectors that are mated when arm 13 is installed.

Sensor 130 functions as both an acoustic sender and an acoustic receiver. The transmitted pulse of sound waves 132 reflects from any objects between arms 13. The reflected signal, arriving a few milliseconds after the end of the transmitted pulse, is converted into an electrical signal. The delay of the reflected signal indicates how far between arms 13 is the object; the strength of the reflected signal indicates how large is the object.

Repeated pulses sent each second detect objects such as people and branches above frame 4 that might impede the proper functioning of module 1. Reflectors 3 having surfaces approximately parallel to waves 132 do not return a large signal. Note that the reflected signals from opposite arm 13b can be used as a calibration signal. Arm 13b reflection signal will always have a fixed time delay after the transmitted pulse. Returned pulses with time delays less than that from arm 13b are in direct proportion to the distance of an unknown object from sensor 130.

Software strategies by microcontroller 127 or supervisory computer can use the delay and size of the sensor 130 return signal to move reflectors 3 appropriately. For example, a person can be burned if part of their body gets near the focal point of reflectors 3 near absorber 2. Sensor 130 can detect a person near absorber 2 and "defocus" reflectors 3. The burn danger comes from the combination of reflected energy from several reflectors 3. Defocusing involves moving the angular position of reflectors 3 a few degrees away from the absorber 2 direction. The heat produced by all reflectors 3 is dispersed rather than concentrated. Another strategy is to move reflectors 3 into safe mode. As reflectors 3 rotate, they do not stay long enough at any one angular position to produce a burn danger.

Temperature sensors 131 close to absorber pipe 31 (FIG. 12) contain information that can determine the efficiency of modules 1. In FIG. 20, temperature sensors 131 are at each end of absorber 2. The difference between temperature measured by sensor 131a and sensor 131b is a function of the heat absorbed by absorber 2. The rate of fluid flow through absorber pipe 31 is set by the angular velocity of positive displacement pump forcing fluid through pipe 31 in absorber 2. The flow rate times the temperature difference is closely related to the energy output of module 1. When microcontroller 127 or array 40 supervisory computer calculates this product, the result identifies modules 1 that are under-performing.

Sensors 131 can also be used to verify proper focus of reflectors 3. Software algorithms can determine if a reflector 3 is properly focused on absorber pipe 31. When a reflector 3 is properly focused, the heat output of module 1 is at its highest. If a reflector 3 is not properly focusing its available solar energy 5 on absorber 2 pipe 31, the output of module 1 is less. Hill climbing software algorithms residing in microcontroller 127 or array 40 supervisory computer can adjust the angular position trajectory of each reflector 3 to optimally extract the highest energy from each module 1 in an array 40.

Although the present invention has been described with reference to certain preferred embodiments thereof, other versions are readily apparent to those of ordinary skill in the art of the preferred embodiments contained herein.

What is claimed is:

1. A solar energy module comprising:
a frame having two opposing and substantially parallel sides and having two opposing and substantially parallel ends perpendicular to said sides, thus forming a rectangle;
a plurality of rectangular-shaped reflectors with each reflector having a weather side face sheet adhesively bonded to a single piece inner core and a reflecting side face sheet adhesively bonded to the same inner core making a weather face sheet-core-reflector face sheet sandwich structure that provides a reflector that is a unitary load bearing structure for withstanding bending and torsion loads, and each reflector having a pair of axle ends such that each reflector is rotationally connected to the ends of said frame;
at least one of said axle ends of each said reflector incorporates individual motor means to rotate each said reflector;
a pair of arms with each arm having an absorber end and a frame end with the frame end of each arm being rigidly attached to the ends of said frame;
an absorber, attached between the absorber ends of said arms and positioned such that said absorber has an axis that is substantially parallel to the axis of rotation of said reflectors such that said absorber absorbs solar energy reflected from said reflectors;
wherein said reflecting side of each reflector can be rotated to face away from said absorber to protect said reflecting surface.

2. A solar energy module comprising:
a frame having two opposing and substantially parallel sides and having two opposing and substantially parallel ends perpendicular to said sides, thus forming a rectangle;
a plurality of rectangular-shaped reflectors with each reflector having a weather side face sheet adhesively bonded to a single piece inner core and a reflecting side face sheet adhesively bonded to the same inner core making a weather face sheet-core-reflector face sheet sandwich structure that provides a reflector that is a unitary load bearing structure for withstanding bending and torsion loads, and each reflector having a pair of axle ends such that each reflector is rotationally connected to the ends of said frame;
at least one of said axle ends of each said reflector incorporates individual motor means to rotate each said reflector;
a pair of arms with each arm having an absorber end and a frame end with the frame end of each arm being rigidly attached to the ends of said frame;
an absorber, attached between the absorber ends of said arms and positioned such that said absorber has an axis that is substantially parallel to the axis of rotations of said reflectors such that said absorber absorbs solar energy reflected from said reflectors.

3. The solar energy module of claim 2 wherein said frame further comprises a cavity within said frame, wherein said cavity is formed from the sides and ends of said frame with the top being provided by the plurality of reflectors wherein when said reflectors are rotated on the axles such that the reflecting sides of said reflectors are facing in towards the cavity, said module is in the safe mode.

4. The solar energy module of claim 3 wherein when said reflectors are rotated on the axles such that the reflecting sides of said reflectors are facing in towards the cavity as in the safe mode and the absorber and the pair of arms are placed within the cavity, such that said module is said to be in the shipping mode such that said modules can be transported to a site wherein a plurality of modules can be joined together with the frames of each module being coplanar to one another and with the absorbers of each module being collinear thus providing a solar energy system.

5. The solar energy module of claim 2 wherein the axles of said reflectors are positioned off the geometric center of each of said reflectors such that when said reflectors are open with said reflecting sides of said reflectors facing the sun, the reflector surfaces of said reflectors extend beyond the planform of said frame, reducing the shadowing of one reflector on another.

6. The solar energy module of claim 2 wherein each of said reflectors is independently rotatable from one another.

7. The solar energy module of claim 2 wherein the reflecting side of each of said reflectors is concave and wherein the weather side of each of said reflectors is convex.

8. The solar energy module of claim 7 further comprising packing brackets to keep the alignment of said reflectors relative to said frame such that a plurality of said modules may be stacked upon one another and transported via a shipping pallet.

9. The solar energy module of claim 2 wherein said arms and said frame also utilize double wall construction with a bonded inner core.

10. The solar energy module of claim 2 wherein said absorber further comprises:
a longitudinal absorber frame having a concave cavity running along the length of said frame, thus providing a reflecting surface;
an absorber tube attached to said absorber frame positioned such that said absorber tube is a predetermined distance from the concave cavity of said absorber frame;
a glass jacket, attached in said absorber frame, surrounding said absorber tube wherein the space between said glass jacket and said absorber tube is a vacuum;
a fluid within said absorber tube such that incoming solar energy from said reflectors reflects from the reflecting surface of said absorber frame and is directed through the glass jacket towards said absorber tube wherein convection heat loss from said absorber tube is reduced by the vacuum between said glass jacket and said absorber tube wherein the fluid within said absorber tube is heated.

11. The solar energy module of claim 2 wherein said absorber incorporates photovoltaic cells that directly convert solar energy into electricity.

12. A solar energy module comprising:
a frame having two opposing and substantially parallel sides and having two opposing and substantially parallel ends perpendicular to said sides, thus forming a rectangle;
a plurality of rectangular-shaped reflectors with each reflector having a weather side face sheet adhesively bonded to a single piece inner core and a reflecting side face sheet adhesively bonded to the same inner core making a weather face sheet-core-reflector face sheet sandwich structure that provides a reflector that is a unitary load bearing structure for withstanding bending and torsion loads, and each reflector having a pair of axle ends such that each reflector is rotationally connected to the ends of said frame;

at least one of said axle ends of each said reflector incorporates individual motor means to rotate each said reflector;

a pair of arms with each said arm having an absorber end and a frame end with the frame end of each arm being rigidly attached to the ends of said frame;

an absorber, attached between the absorber ends of said arms and positioned such that said absorber has an axis that is substantially parallel to the axis of rotation of said reflectors such that said absorber absorbs solar energy reflected from said reflectors;

sensor means providing feedback to said motor means to rotate each said reflector in order to move and focus said reflectors to obtain maximum energy, to diagnose failed components, defocusing as a safety precaution and turning said reflectors down into a safe mode.

\* \* \* \* \*